(12) United States Patent
Itoh et al.

(10) Patent No.: US 8,048,613 B2
(45) Date of Patent: Nov. 1, 2011

(54) ALKALI DEVELOPMENT-TYPE SOLDER RESIST, CURED PRODUCT THEREOF, AND PRINTED WIRING BOARD PREPARED BY USING THE SAME

(75) Inventors: Nobuhito Itoh, Hiki-gun (JP); Yoko Shibasaki, Hiki-gun (JP); Kenji Kato, Hiki-gun (JP); Masao Arima, Hiki-gun (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 292 days.

(21) Appl. No.: 12/249,981

(22) Filed: Oct. 13, 2008

(65) Prior Publication Data

US 2009/0038834 A1 Feb. 12, 2009

Related U.S. Application Data

(63) Continuation of application No. PCT/JP2007/057421, filed on Apr. 3, 2007.

(30) Foreign Application Priority Data

Apr. 13, 2006 (JP) ................................. 2006-110411
Apr. 13, 2006 (JP) ................................. 2006-110443

(51) Int. Cl.
*G03F 7/038* (2006.01)
*G03F 7/30* (2006.01)

(52) U.S. Cl. ............... 430/280.1; 430/285.1; 430/286.1; 430/287.1; 430/916; 430/919; 430/920; 430/922; 430/921; 430/923; 430/924; 430/926; 430/277.1; 430/18; 430/311; 430/32; 430/330; 522/26; 522/27; 522/28; 522/33; 522/53; 522/50; 522/57; 522/63; 522/65; 522/103; 522/913

(58) Field of Classification Search ........................... None
See application file for complete search history.

(56) References Cited

U.S. PATENT DOCUMENTS

| 2008/0308301 | A1 * | 12/2008 | Itoh et al. | 174/250 |
| 2009/0029181 | A1 * | 1/2009 | Shibasaki et al. | 428/457 |
| 2009/0194319 | A1 * | 8/2009 | Itoh et al. | 174/250 |

FOREIGN PATENT DOCUMENTS

| CN | 1299812 A | | 6/2001 |
| CN | 1514845 A | | 7/2004 |
| EP | 1568723 A1 * | 8/2005 |
| JP | 9-80749 | | 3/1997 |
| JP | 2000-338665 | * | 12/2000 |
| JP | 2000-338665 A | | 12/2000 |
| JP | 2001-235858 | | 8/2001 |
| JP | 2003-280193 A | | 10/2003 |
| JP | 2005-077451 A | | 3/2005 |
| JP | 2006-259150 A | | 9/2006 |
| WO | WO 02/096969 | | 12/2002 |
| WO | WO 2006/129697 A1 | | 12/2006 |
| WO | WO 2007/004334 A1 | | 1/2007 |
| WO | WO-2007/111336 A1 * | 10/2007 |
| WO | WO-2008/059670 A1 * | 5/2008 |
| WO | WO-2008/120491 A1 * | 10/2008 |

OTHER PUBLICATIONS

Anonylmously, IP.com No. IPCOM000029578D from www.ip.com published Jul. 8, 2004, 6 pages.*
Weidenbruck, Gabriel IP.com No. IPCOM000016456Dfrom www.cio.com, published Jun. 23, 2003, three pages.*
Engish translation, machine generated of JP 2000-338665 A, generated Apr. 23, 2010,14 pages.*
AN 2000:863752, entered into STN Dec. 11, 2000, English abstract of JP 2000338665 A, to Kusaka, ACS on STN in the CAplus file, 13 pages.*
Davignon et al "Porce4ssing High Density Boards with UV Lasers", article from Circuit tee posted on line Oct. 1, 2004, at http://sss.circuitree.com, 11 pages.*
U.S. Appl. No. 12/389,987, filed Feb. 20, 2009, Itoh, et al.
U.S. Appl. No. 12/240,660, filed Sep. 29, 2008, Shibasaki, et al.
Office Action issued Apr. 26, 2011, in Chinese Patent Application No. 200780013332.1 (with English-language translation).

* cited by examiner

*Primary Examiner* — Cynthia Hamilton
(74) *Attorney, Agent, or Firm* — Oblon, Spivak, McClelland, Maier & Neustadt, L.L.P.

(57) ABSTRACT

An alkali development-type solder resist includes (A) a carboxyl group-containing photosensitive resin obtained by reacting (a) a compound having two or more cyclic ether or thioether groups in the molecule with (b) an unsaturated monocarboxylic acid, reacting the product with (c) a polybasic acid anhydride, reacting the resulting resin with (d) a compound having a cyclic ether group and an ethylenic unsaturated group in the molecule, and reacting the product additionally with (c) a polybasic acid anhydride, (B) an oxime ester-based photopolymerization initiator containing a specific oxime ester group, (C) a compound having two or more ethylenic unsaturated groups in the molecule, and (D) a thermosetting component, wherein the dry film obtained by applying the composition has an absorbance of 0.3 to 1.2 per 25 μm of the film thickness at a wavelength of 350 to 375 nm.

24 Claims, 1 Drawing Sheet

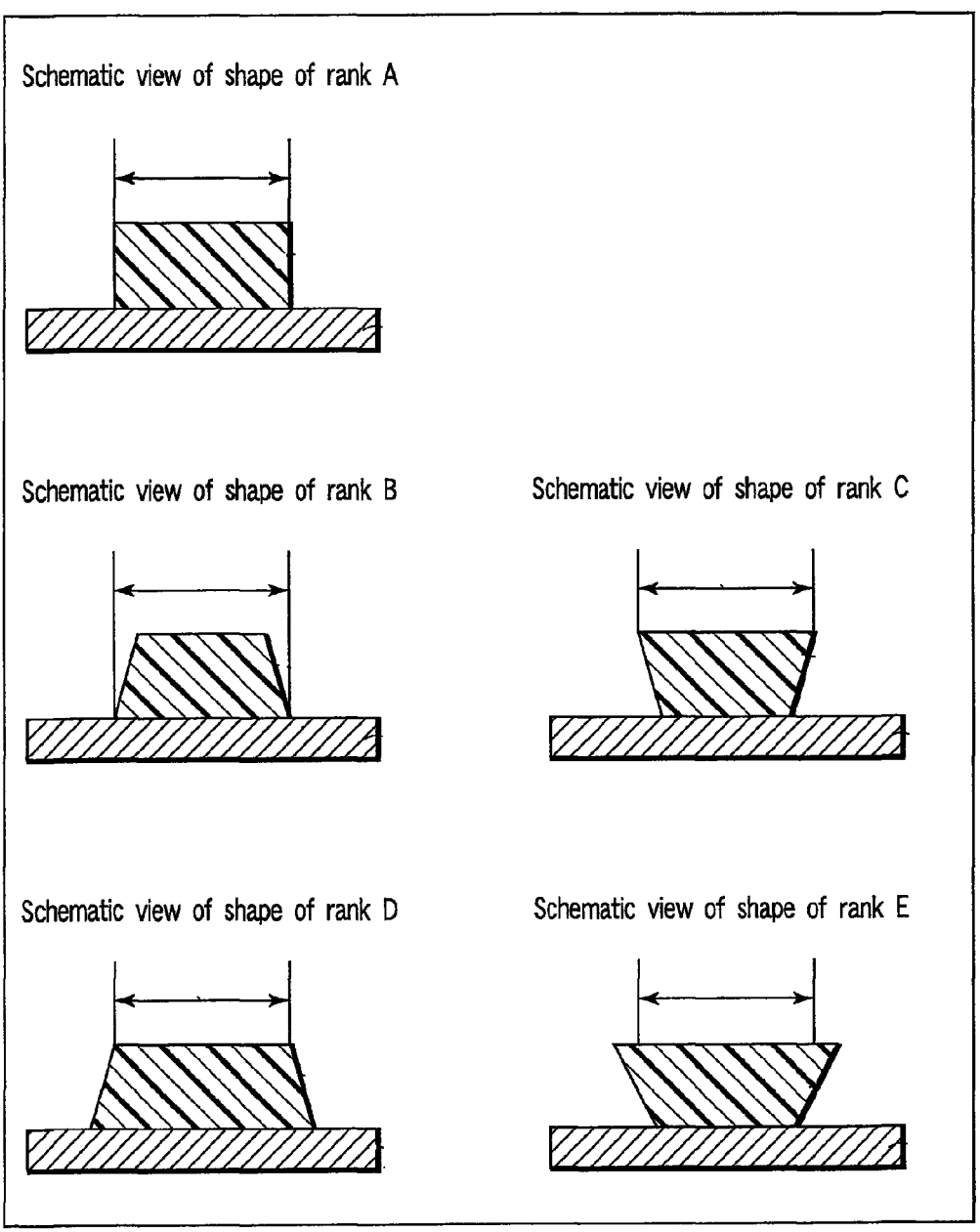
FIGURE

ALKALI DEVELOPMENT-TYPE SOLDER RESIST, CURED PRODUCT THEREOF, AND PRINTED WIRING BOARD PREPARED BY USING THE SAME

CROSS-REFERENCE TO RELATED APPLICATIONS

This is a Continuation Application of PCT Application No. PCT/JP2007/057421, filed Apr. 3, 2007, which was published under PCT Article 21(2) in Japanese.

This application is based upon and claims the benefit of priority from prior Japanese Patent Applications No. 2006-110411, filed Apr. 13, 2006; and No. 2006-110443, filed Apr. 13, 2006, the entire contents of which are incorporated herein by reference.

BACKGROUND OF THE INVENTION

1. Field of the Invention

The present invention relates to an alkali development-type solder resist useful in production of printed wiring boards, the cured product thereof and the printed wiring board prepared by using the same, and in particular, to an alkali development-type solder resist hardenable by a laser-emitting light source at a maximum wavelength of 350 to 375 nm or 400 to 410 nm, and the cured product thereof, and the printed wiring board obtained by using the same.

2. Description of the Related Art

Printed wiring boards for electronic devices have a solder resist film formed as the outermost layer. The solder resist film is a protective coating material covering the surface of a printed wiring board and preventing adhesion of undesired solder on the circuit surface during application of solder and mounting of components. It is the protective film that protects the copper foil circuit of a printed wiring board from humidity, dust, etc. as a permanent protective mask and also the circuit from electrical problems as an insulator, and is superior in chemical and heat resistance and also resistant to the high temperatures encountered during soldering or gold plating. The solder resist film is generally formed by a photolithographic method of irradiating a patterned high-energy ray through a mask pattern. It is possible to select regions demanding no soldering by using the mask pattern.

A laser direct imaging method of using a laser beam as beam source was commercialized recently as an environmentally friendly photolithographic method for resources and energy conservation. Direct imaging apparatuses are apparatuses drawing a pattern-data image directly on a printed circuit board carrying a laser beam-sensitive photocurable resin composition formed thereon, by direct high-speed laser beam irradiation. It is characteristic in that it demands no mask pattern, allows shortening of the production process and drastic reduction of the cost, and is suitable for multi-kind/small-lot and short-delivery-time production.

In such a direct imaging apparatus, in which all the surfaces in the light-exposing regions are not exposed to light simultaneously as by conventional mask pattern exposure, the light-exposing and non-exposing regions are chosen before exposure of the film, consecutively by on/off of the laser shutter. Thus, it is necessary to expose the film at high speed, to obtain an exposure time close to that obtained by the conventional mask pattern exposure. In addition, the beam sources used by conventional mask pattern exposure were those emitting a light having a wide wavelength range of 300 to 500 nm, such as metal halide lamp, but a semiconductor laser is used instead as the beam source in the direct imaging apparatus, although the beam source and the wavelength may vary according to the application of the photocurable resin composition used, and the wavelength commonly used is 355 nm or 405 nm.

However, conventional solder resists, when exposed to a light at a wavelength of 355 nm or 405 nm in a direct imaging apparatus, do not form films satisfying the requirements, such as in heat resistance and insulating property, demanded for solder resists. This is because conventional solder resists contain a photopolymerization initiator such as benzyl, benzoin ether, Michler's ketone, anthraquinone, acridine, phenazine, benzophenone, or α-acetophenone-based initiator, which does not have a sufficiently high photopolymerization potential only with a single wavelength light for example at 355 nm or 405 nm. Thus, photopolymerizable compositions containing a conventional photopolymerization initiator are extremely limited in their application range.

For this reason, photopolymerization initiators having a high photopolymerization potential even with a single wavelength light at 355 nm or 405 nm and compositions prepared by using the photopolymerization initiator were proposed (see e.g., Patent Documents 1 and 2). However, although these methods have a sufficient photopolymerization potential even with a single wavelength light at 355 nm or 405 nm, they still have problems, for example, that it was not possible to obtain simultaneously high in-depth hardenability and surface hardenability because of its very high photopolymerization rate and that there is a drastic drop in sensitivity because of inactivation of the photopolymerization initiator on the circuit after heat treatment and also exfoliation of the film on the copper circuit.

In addition, direct imaging by using a laser beam, which is generally performed under an atmospheric environment, often is sensitive to reaction inhibition by oxygen, and thus, removal of the surface of some desired region occurs in the developing process of removing an undesired region after exposure, consequently causing a problem of low glossiness. Further, low glossiness of the solder resist, which is used for protection of printed wiring boards, causes problems of unfavorable appearance and also low chemical resistance as well as low electrical properties of the part of the surface where the hardening reaction is insufficient.

Photocurable resins improved in photohardening efficiency by increase in the density of photosensitive groups were proposed (e.g., Patent Document 3), but they are still not compatible with laser direct imaging.

Patent Document 1: Jpn. Pat. Appln. KOKAI Publication No. 2001-235858 (claims)
Patent Document 2: WO02/096969 (claims)
Patent Document 3: Jpn. Pat. Appln. KOKAI Publication No. 9-80749 (claims)

BRIEF SUMMARY OF THE INVENTION

An object of the present invention is to provide an alkali development-type solder resist that has a high photopolymerization potential to a laser beam at a wavelength of 350 to 375 nm or 400 to 410 mm, sufficiently high in-depth hardenability and favorable heat stability, the cured product thereof, and a printed wiring board carrying a pattern formed by using the same.

After intensive studies to achieve the object above, the inventors have found in a first embodiment that an alkali development-type solder resist in the following configuration exhibits a high photopolymerization potential to a laser beam at a wavelength of 350 to 375 nm and sufficient high in-depth hardenability, and is also superior in heat stability, electroless gold plating resistance, and water resistance.

Thus provided by the present invention is: an alkali development-type solder resist, which is a composition comprising: (A) a carboxyl group-containing photosensitive resin obtained by reacting (a) a compound having two or more cyclic ether or thioether groups in the molecule with (b) an unsaturated monocarboxylic acid; reacting the product with (c) a polybasic acid anhydride; reacting the resulting resin with (d) a compound having a cyclic ether group and an ethylenic unsaturated group in the molecule; and reacting the product additionally with (c) a polybasic acid anhydride; (B) an oxime ester-based photopolymerization initiator containing an oxime ester group represented by the following General Formula (I):

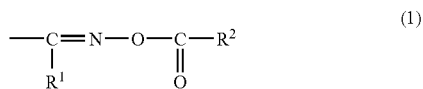

(wherein, $R^1$ represents a hydrogen atom, an alkyl group having 1 to 7 carbon atoms, or a phenyl group; and $R^2$ represents an alkyl group having 1 to 7 carbon atoms or a phenyl group);
(C) a compound having two or more ethylenic unsaturated groups in the molecule; and
(D) a thermosetting component, that can be developed with a dilute aqueous alkali solution, wherein the absorbance of the dry film at a wavelength of 350 to 375 nm is 0.3 to 1.2 per 25 μm of the film thickness.

The inventors have also found, in a second embodiment, that an alkali development-type solder resist in the following configuration exhibits a favorably high photopolymerization potential to a laser beam at a wavelength of 400 to 410 nm and sufficient high in-depth hardenability, and is also superior in heat stability, electroless gold plating resistance, and water resistance.

Accordingly provided by the present invention is: an alkali development-type solder resist, which is a composition comprising (A) a carboxyl group-containing photosensitive resin, obtained by reacting (a) a compound having two or more cyclic ether or thioether groups in the molecule with (b) an unsaturated monocarboxylic acid; reacting the product with (c) a polybasic acid anhydride; reacting the resulting resin with (d) a compound having a cyclic ether group and an ethylenic unsaturated group in the molecule; and reacting the product additionally with (c) a polybasic acid anhydride;
(B) an oxime ester-based photopolymerization initiator containing an oxime ester group represented by the following General Formula (I):

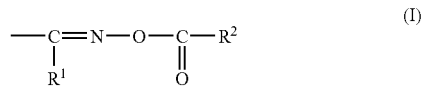

(wherein, $R^1$ represents a hydrogen atom, an alkyl group having 1 to 7 carbon atoms, or a phenyl group; and $R^2$ represents an alkyl group having 1 to 7 carbon atoms or a phenyl group);
(C) a compound having two or more ethylenic unsaturated groups in the molecule;
(D) a thermosetting component; and (E) at least one sensitizer selected from the group consisting of a thioxanthone-based sensitizer, coumarin-based sensitizer, alkylaminobenzophenone-based sensitizer;
that can be developed with a dilute alkaline solution, wherein the absorbance of the dry film at a wavelength of 400 to 410 nm is 0.3 to 1.2 per 25 μm of the film thickness.

The inventors also found, in a third embodiment, an alkali development-type solder resist, comprising, as the carboxyl group-containing photosensitive resin (A) in the first and second embodiments, (a) a carboxyl group-containing photosensitive resin, prepared by reacting a compound having two or more cyclic ether groups or cyclic thioether groups in the molecule with acrylic or methacrylic acid (b-1) and a compound (b-2) represented by the following General Formula (II):

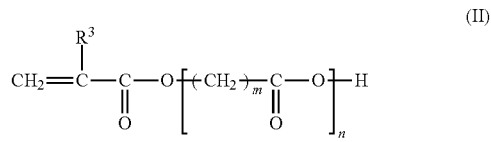

(wherein, $R^3$ represents a hydrogen atom or a methyl group; m is an integer of 3 to 7; and an average value of n is an integer of 1 to 4.);
reacting the product with (c) a polybasic acid anhydride; and additionally reacting the product with (d) a compound having a cyclic ether group and an ethylenic unsaturated group in the molecule, and thus, accomplishing the present invention.

The form of the alkali development-type solder resist according to the present invention provided may be liquid or a photosensitive dry film.

The present invention also provides a cured product of an alkali development-type solder resist according to the present invention and a printed wiring board carrying a pattern formed with the cured product.

The alkali development-type solder resist according to the present invention is superior in in-depth hardenability and enables formation of a pattern without halation or undercut by irradiation of a laser-emitting light source at a wavelength of 350 to 375 nm or 400 to 410 nm, and thus, can be used as a laser-direct-imaging solder resist.

In addition, use of such a solder resist for laser direct imaging eliminates the need for a negative pattern and is thus effective in improving initial productivity and reducing the production cost.

Moreover, the alkali development-type solder resist according to the present invention, which is superior in in-depth hardenability, sensitivity and resolution, enables to produce highly reliable and high quality printed wiring boards.

BRIEF DESCRIPTION OF THE SEVERAL VIEWS OF THE DRAWING

The single FIGURE is a schematic view illustrating a cross section of a resin composition obtained after photoexposure and development.

DETAILED DESCRIPTION OF THE INVENTION

One of the common characteristics of the alkali development-type solder resists in the first and second embodiments of the present invention is use of (A) a high-sensitivity carboxyl group-containing photosensitive resin, prepared by reacting (a) a compound having two or more cyclic ether or thioether groups in the molecule with (b) an unsaturated monocarboxylic acid; reacting the product with (c) a polybasic acid anhydride; reacting the resulting resin with (d) a compound having a cyclic ether group and an ethylenic unsaturated group in the molecule; and reacting the product additionally with (c) a polybasic acid anhydride, or (A) a carboxyl group-containing photosensitive resin, prepared by reacting (a) a compound having two or more cyclic ether or thioether groups in the molecule with acrylic or methacrylic acid (b-1) and a compound (b-2) represented by General Formula (II), reacting the product with (c) a polybasic acid anhydride, and reacting the resulting resin additionally with (d) a compound having a cyclic ether group and an ethylenic unsaturated group in the molecule.

The second characteristic is use of (B) an oxime ester-based photopolymerization initiator containing an oxime ester group represented by General Formula (I), for improvement in sensitivity.

Further, the alkali development-type solder resist in the second embodiment of the present invention is characterized additionally by containing (E) at least one sensitizer selected from the group consisting of thioxanthone-based sensitizers, coumarin-based sensitizers and alkylaminobenzophenone-based sensitizers.

Hereinafter, respective constituent components in the alkali development-type solder resist according to the present invention will be described in detail.

The carboxyl group-containing photosensitive resin (A) contained in the alkali development-type solder resist according to the present invention is a carboxyl group-containing photosensitive resin, obtained by reacting (a) a compound having two or more cyclic ether or thioether groups in the molecule with (b) an unsaturated monocarboxylic acid; reacting the product with (c) a polybasic acid anhydride; reacting the resulting resin with (d) a compound having a cyclic ether group and an ethylenic unsaturated group in the molecule; and reacting the product additionally with (c) a polybasic acid anhydride. In this way, a compound having two or more cyclic ether or thioether groups in the molecule (a) is reacted with an unsaturated monocarboxylic acid (b); a polybasic acid anhydride (c) is added to the mixture; and the product is further reacted with a compound having a cyclic ether group and an ethylenic unsaturated group in the molecule, for introduction of a photosensitive group. However, the reaction leads to a drop in the number of free carboxyl groups and in solubility in aqueous alkaline solution, due to addition of the polybasic acid anhydride (c), and thus, the polybasic acid anhydride (c) is reacted with it for improvement in solubility in aqueous alkaline solution.

The unsaturated monocarboxylic acid (b) may be used together with a compound represented by General Formula (II) in the third embodiment.

The third embodiment relates to a carboxyl group-containing photosensitive resin, prepared by reacting (a) a compound having two or more cyclic ether or thioether groups in the molecule with acrylic or methacrylic acid (b-1) with a compound (b-2) represented by General Formula (II):

reacting the product with (c) a polybasic acid anhydride, and reacting the resulting resin additionally with (d) a compound having a cyclic ether group and an ethylenic unsaturated group in the molecule. Thus, use of compounds different in molecular length as the unsaturated monocarboxylic acid prevents intramolecular polymerization, and use of a long-chain unsaturated monocarboxylic acid higher in freedom of movement allows improvement in sensitivity.

Examples of the compound having two or more cyclic ether or thioether groups in the molecule (a) used in preparation of the carboxyl group-containing photosensitive resin (A) include (a-1) multifunctional epoxy resins having two or more epoxy groups in the molecule, (a-2) multifunctional oxetane compounds having two or more oxetane rings in the molecule, (a-3) episulfide resins having two or more thiirane rings in the molecule, and the like.

Examples of the multifunctional epoxy resins (a-1) include phenolic novolak-type epoxy resins, cresol novolac-type epoxy resins, bisphenol A novolac-type epoxy resins, bisphenol-type multifunctional epoxy resins multi-functionalized in reaction of the secondary hydroxyl groups of bisphenol-type epoxy resin with epihalohydrin, trisphenolmethane-type epoxy resins prepared by using salicyl aldehyde and copolymer resins of glycidyl (meth)acrylate, and the like. Particularly preferable among them are cresol novolac-type epoxy resins.

Examples of the multifunctional oxetane compounds (a-2) include multifunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, the oligomers or copolymers thereof; etherified derivatives thereof with a hydroxyl group-containing resin such as oxetane alcohol/novolac resins poly (p-hydroxystyrene), cardobisphenol, calixarene, calixresorcinarene or silsesquioxane; and the like. Other examples thereof include copolymers of an oxetane ring-containing unsaturated monomer and an alkyl (meth)acrylate, and the like.

Examples of the multifunctional episulfide resins (a-3) include a bisphenol A-type episulfide resin YL7000 manufactured by Japan Epoxy Resins Co., Ltd., and the like. The episulfide resins, used by a similar synthetic method, that have sulfur atoms replacing the oxygen atoms of the epoxy groups of novolac-type epoxy resins can also be used.

Examples of the unsaturated monocarboxylic acids (b) for use in preparation of the carboxyl group-containing photosensitive resin (A) according to the present invention include acrylic acid, acrylic acid dimer, methacrylic acid, β-styrylacrylic acid, β-furfurylacrylic acid, crotonic acid, α-cyano-cinnamic acid, cinnamic acid, half esters between a saturated or unsaturated bibasic acid anhydride and a (meth)acrylate having one hydroxyl group in the molecule, and the compounds (b-2) represented by the following General Formula (II):

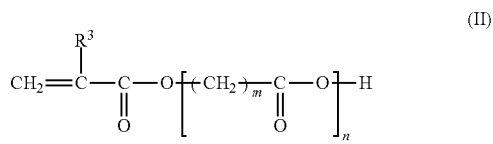

(II)

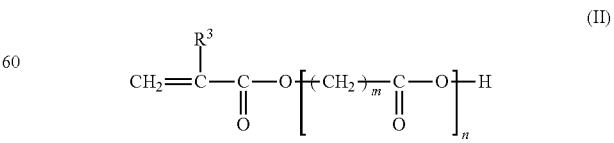

(II)

(wherein, $R^3$ represents a hydrogen atom or a methyl group; m is an integer of 3 to 7; and an average value of n is an integer of 1 to 4.);

(wherein, $R^3$ represents a hydrogen atom or a methyl group; m is an integer of 3 to 7; and an average value of n is an integer of 1 to 4.) and the like.

The compound (b-2) represented by General Formula (II) can be prepared in reaction of a lactone monomer such as five-membered-ring γ-butylolactone, six-membered-ring δ-valerolactone, 7-membered-ring ε-caprolactone, or 8 membered-ring ξ-enantolactone with acrylic or methacrylic acid. In particular, an ε-caprolactone-modified (meth)acrylate prepared from ε-caprolactone and (meth)acrylic acid is preferable from its reactivity, water resistance, etc. factors.

Particularly preferable among these unsaturated monocarboxylic acids (b) above are acrylic or methacrylic acid (b-1) and the compounds (b-2) represented by General Formula (II). These unsaturated monocarboxylic acids (b) may be used alone or in combination of two or more, but use of (b-1) and (b-2) in combination is particularly preferable.

Examples of the polybasic acid anhydrides (c) for use in preparation of the carboxyl group-containing photosensitive resin (A) according to the present invention include acid anhydrides such as succinic anhydride, maleic anhydride, phthalic anhydride, tetrahydrophthalic anhydride, hexahydrophthalic anhydride, methyltetrahydrophthalic anhydride, 3,6-endomethylenetetrahydrophthalic anhydride, methylendomethylenetetrahydrophthalic anhydride and tetrabromophthalic anhydride, and one or more of them may be used in combination.

Examples of the compound (d) having a cyclic ether group and an ethylenic unsaturated group in the molecule for use in preparation of the carboxyl group-containing photosensitive resin (A) according to the present invention include glycidyl (meth)acrylate, 3,4-epoxycyclohexyl methyl (meth)acrylate, 3,4-epoxycyclohexylethyl (meth)acrylate, 3,4-epoxycyclohexylbutyl (meth)acrylate, 3,4-epoxycyclohexylmethyl aminoacrylate and the like.

The solid-matter acid value of the carboxyl group-containing photosensitive resin (A) thus obtained is in the range of 40 to 110 mg-KOH/g, preferably in the range of 50 to 80 mg-KOH/g. An acid value lower than the range above leads to deterioration in solubility of the resulting resin in aqueous alkaline solution and is thus unfavorable. On the other hand, an acid value larger than the range above leads to residual of unreacted polybasic acid anhydride and decrease in resin stability and is thus unfavorable.

The carboxyl group-containing photosensitive resin (A) according to the present invention may be used in combination with any one or more of the commonly known carboxyl group-containing photosensitive resins listed below, in the range that does not lead to deterioration in properties of the resin when added:

(1) carboxyl group-containing photosensitive copolymer resins obtained by copolymerization of an unsaturated carboxylic acid such as (meth)acrylic acid with one or more of the other unsaturated double bond-containing compounds;
(2) carboxyl group-containing photosensitive copolymer resins obtained by adding an ethylenic unsaturated group as a pendant to a copolymer of an unsaturated carboxylic acid such as (meth)acrylic acid and one or more other compounds having an unsaturated double bond with a compound having an epoxy group and an unsaturated double bond such as glycidyl (meth)acrylate or 3,4-epoxycyclohexylmethyl (meth)acrylate or (meth)acrylic chloride;
(3) carboxyl group-containing photosensitive copolymer resins obtained by allowing an unsaturated carboxylic acid such as (meth)acrylic acid to react with a copolymer of a compound having an epoxy group and an unsaturated double bond such as glycidyl (meth)acrylate or 3,4-epoxycyclohexylmethyl (meth)acrylate and another compound having an unsaturated double bond and also allowing a polybasic acid anhydride to react with the generated secondary hydroxyl group;
(4) carboxyl group-containing photosensitive copolymer resins obtained by allowing a compound having a hydroxyl group and an unsaturated double bond such as 2-hydroxyethyl (meth)acrylate to react with a copolymer of an acid anhydride having an unsaturated double bond such as maleic anhydride and another compound having an unsaturated double bond;
(5) carboxyl group-containing photosensitive copolymer resins obtained by allowing a multifunctional epoxy compound to react with an unsaturated monocarboxylic acid and then allowing a saturated or unsaturated polybasic acid anhydride to react with the generated hydroxyl group;
(6) carboxyl group-containing photosensitive copolymer resins having hydroxyl groups obtained by allowing a saturated or unsaturated polybasic acid anhydride to react with a hydroxyl group-containing polymer such as a polyvinyl alcohol derivative and then allowing a compound having an epoxy group and an unsaturated double bond in one molecule to react with the generated carboxylic acid;
(7) carboxyl group-containing photosensitive copolymer resins obtained by allowing a saturated or unsaturated polybasic acid anhydride to react with a reaction product of a multifunctional epoxy compound, an unsaturated monocarboxylic acid, and a compound having at least one alcoholic hydroxyl group and a reactive group reactive with an epoxy group other than the alcoholic hydroxyl group in one molecule;
(8) carboxyl group-containing photosensitive copolymer resins obtained by allowing an unsaturated monocarboxylic acid to react with a multifunctional oxetane compound having at least two oxetane rings in one molecule and then allowing a saturated or unsaturated polybasic acid anhydride to react with the primary hydroxyl groups in the modified oxetane resin obtained; and
(9) carboxyl group-containing photosensitive copolymer resins obtained by allowing a compound having one oxirane ring and one or more ethylenic unsaturated groups in the molecule to react with a carboxyl group-containing resin that is previously obtained by allowing an unsaturated monocarboxylic acid and then a polybasic acid anhydride to react with a multifunctional epoxy resin.

The (meth)acrylate in the present description is a generic term indicating both acrylate, methacrylate and mixtures thereof, and other similar terms are also similar general terms.

The content of the carboxyl group-containing photosensitive resin (A) is 20 to 60 mass %, preferably 30 to 50 mass %, in the entire composition. A content of lower than the range above unfavorably leads to deterioration in film strength. On the other hand, a content of more than the range above also unfavorably leads to increase in viscosity or deterioration in coating efficiency or the like.

The oxime ester-based photopolymerization initiator (B) for use in the present invention is an oxime ester-based photopolymerization initiator containing an oxime ester group represented by the following General Formula (I):

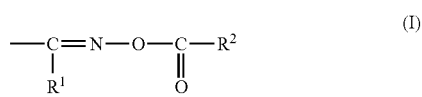

(I)

(wherein, $R^1$ represents a hydrogen atom, an alkyl group having 1 to 7 carbon atoms or a phenyl group; and $R^2$ represents an alkyl group having 1 to 7 carbon atoms or a phenyl group), and examples thereof include those described in Patent Document 1 and the like. Favorable examples of the oxime ester-based photopolymerization initiators (B) include the compound represented by the following Formula (V):

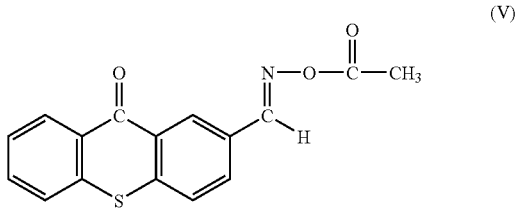

(2-(acetyloxyiminomethyl)thioxanthen-9-one), and the compounds represented by the following Formulae (VI) and (VII):

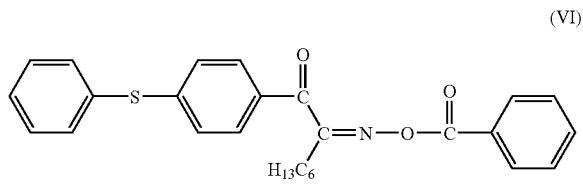

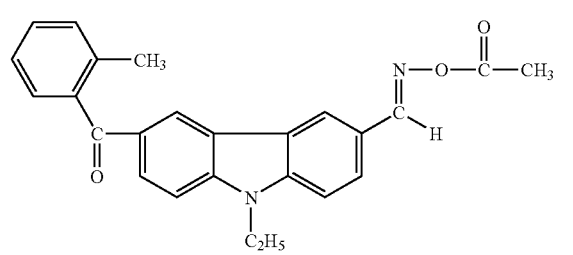

(1,2-octandione, I-[4-(phenylthio)-, 2-(O-benzoyloxime)], and ethanone, 1-[9-ethyl-6-(2-methylbenzoyl)-9H-carbazol-3-yl]-, 1-(O-acetyloxime)). Examples of the commercially available products include CGI-325, Irgacure-OXE01 and Irgacure-OXE02, available from Ciba Specialty Chemicals.

Alkali development-type solder resists containing such an oxime ester-based photopolymerization initiator (B), when coated alone on a copper plate such as a printed wiring board, reacts with copper atoms at the interface with copper by the heat during preliminary drying, with its function as photopolymerization initiator inactivated, and thus, combined use thereof with an aminoacetophenone-based photopolymerization initiator (F) or an acylphosphine oxide-based photopolymerization initiator (G) described below is preferable.

The content of the oxime ester-based photopolymerization initiator (B) is 0.01 to 20 parts by mass, preferably 0.01 to 5 parts by mass, with respect to 100 parts by mass of the carboxyl group-containing photosensitive resin (A). When the content of the oxime ester-based photopolymerization initiator (B) is less than 0.01 parts by mass with respect to 100 parts by mass of the carboxyl group-containing photosensitive resin (A), the photocurable components (components (A) and (c)) are not hardened sufficiently by a light in the wavelength ranges of 350 to 375 nm and 400 to 410 nm, resulting in increase in hygroscopicity of the hardened film and easier deterioration in pressure cooker resistance (PCT resistance) and also in solder heat resistance and electroless plating resistance. On the other hand, a content of the oxime ester-based photopolymerization initiator (B) of more than 20 parts by mass with respect to 100 parts by mass of the carboxylic acid-containing resin (A) leads to deterioration in developing efficiency and electroless plating resistance of the hardened film and also in PCT resistance.

The compound (c) having two or more ethylenic unsaturated groups in the molecule for use in the alkali development-type solder resist according to the present invention is a compound that hardens by irradiation of a high-energy ray and makes or assists to make the carboxyl group-containing photosensitive resin (A) insoluble in an aqueous alkaline solution.

Examples of the compounds include diacrylates of glycols such as ethylene glycol, methoxytetraethylene glycol, polyethylene glycol, and propylene glycol; acrylates of polyvalent alcohols such as hexanediol, trimethylolpropane, pentaerythritol, dipentaerythritol, tris-hydroxyethyl isocyanurate or the ethyleneoxide adducts or propyleneoxide adducts thereof; polyvalent acrylates such as phenoxy acrylate, bisphenol A diacrylate and ethyleneoxide, or the propyleneoxide adducts of these phenols; polyvalent acrylates of glycidyl ethers such as glycerol diglycidyl ether, glycerol triglycidyl ether, trimethylolpropane triglycidyl ether, and triglycidyl isocyanurate; and melamine acrylates, and/or the methacrylates corresponding thereto; and the like.

Other examples thereof include epoxy acrylate resins obtained in reaction of a multifunctional epoxy resin such as cresol novolac-type epoxy resin with acrylic acid; epoxy urethane acrylate compounds obtained in reaction of the hydroxyl groups of the resulting epoxy acrylate resin with a half urethane compound obtained from a hydroxy acrylate such as pentaerythritol triacrylate and a diisocyanate such as isophorone diisocyanate; and the like. Such an epoxy acrylate-based resin improves the photohardening efficiency, without deterioration in dry tack properties.

The content of the compound having two or more ethylenic unsaturated groups in the molecule (c) is 5 to 100 parts by mass, more preferably 1 to 70 parts by mass, with respect to 100 parts by mass of the carboxyl group-containing photosensitive resin (A). The content of less than 5 parts by mass unfavorably leads to deterioration in photohardening efficiency and difficulty in forming a pattern by alkali development after high-energy ray irradiation. Alternatively, a content of more than 100 parts by mass unfavorably leads to deterioration in solubility in aqueous alkaline solution and embrittlement of the resulting film.

Examples of the thermosetting components (D) for use in the present invention include commonly known thermosetting resins such as amino resins including melamine resins and benzoguanamine resins, block isocyanate compounds, cyclic carbonate compounds, multifunctional epoxy compounds, multifunctional oxetane compounds, episulfide resins, and the like. Particularly favorable among them are multifunctional epoxy compounds (D-1), multifunctional oxetane compounds (D-2), and thermosetting components having two or more cyclic ether groups and/or cyclic thioether groups in the molecule (hereinafter, referred to as cyclic (thio)ether compounds) such as episulfide resins. The content of the thermosetting component (D) is preferably 5 to 70 parts by mass, more preferably 10 to 60 parts by mass, with respect to 100 parts by mass of the carboxyl group-containing photosensitive resin (A).

Examples of the multifunctional epoxy compounds (D-1) include, but are not limited to, bisphenol A-type epoxy resins including Epikote 828, Epikote 834, Epikote 1001 and Epikote 1004 manufactured by Japan Epoxy Resins Co., Ltd., Epichlone 840, Epichlone 850, Epichlone 1050 and Epichlone 2055 manufactured By Dainippon Ink and Chemicals Inc., Epotohto YD-011, YD-013, YD-127 and YD-128 manufactured by Tohto Kasei Co., Ltd., D,E.R.317, D.E.R.331, D.E.R.661 and D.E.R.664 manufactured by Dow Chemical Company, Araldite 6071, Araldite 6084, Araldite GY250 and Araldite GY260 manufactured by Ciba Specialty Chemicals, Sumi-epoxy ESA-011, ESA-014, ELA-115 and ELA-128 manufactured by Sumitomo Chemical, A.E.R.330, A.E.R.331, A.E.R.661 and A.E.R.664 manufactured by Asahi Kasei Corp., etc. (all, product names); brominated epoxy resins including Epikote YL903 manufactured by Japan Epoxy Resins Co., Ltd., Epichlone 152 and Epichlone 165 manufactured by Dainippon Ink and Chemicals Inc., Epotohto YDB-400 and YDB-500 manufactured by Tohto Kasei Co., Ltd., D.E.R.542 manufactured by Dow Chemical Company, Araldite 8011 manufactured by Ciba Specialty Chemicals, Sumi-epoxy ESB-400 and ESB-700 manufactured by Sumitomo Chemical, A.E.R.711 and A.E.R.714 manufactured by Asahi Kasei Corp., etc. (all, product names); novolac-type epoxy resin including Epikote 152 and Epikote 154 manufactured by Japan Epoxy Resins Co., Ltd., D.E.N.431 and D.E.N.438 manufactured by Dow Chemical Company, Epichlone N-730, Epichlone N-770 and Epichlone N-865 manufactured by Dainippon Ink and Chemicals, Inc., Epotohto YDCN-701 and YDCN-704 manufactured by Tohto Kasei Co., Ltd., Araldite ECN1235, Araldite ECN1273, Araldite ECN1299 and Araldite XPY307 manufactured by Ciba Specialty Chemicals, EPPN-201, EOCN-1025, EOCN-1020, EOCN-104S and RE-306 manufactured by Nippon Kayaku Co., Ltd., Sumi-epoxy ESCN-195x and ESCN-220 manufactured by Sumitomo Chemical, A.E.R.ECN-235 and ECN-299 manufactured by Asahi Kasei Corp., etc. (all, product names); bisphenol F-type epoxy resins including Epichlone 830 manufactured by Dainippon Ink and Chemicals Inc., Epikote 807 manufactured by Japan Epoxy Resins Co., Ltd., Epotohto YDF-170, YDF-175 and YDF-2004 manufactured by Tohto Kasei Co., Ltd., Araldite XPY306 manufactured by Ciba Specialty Chemicals, etc. (all, product names);

hydrogenated bisphenol A-type epoxy resins including Epotohto ST-2004, ST-2007 and ST-3000 manufactured by Tohto Kasei Co., Ltd. (product name) etc.;

glycidylamine-type epoxy resins including Epikote 604 manufactured by Japan Epoxy Resins Co., Ltd., Epotohto YH-434 manufactured by Tohto Kasei Co., Ltd., Araldite MY720 manufactured by Ciba Specialty Chemicals, Sumi-epoxy ELM-120 manufactured by Sumitomo Chemical etc. (all, product names);

hydantoin type epoxy resins including Araldite CY350 manufactured by Ciba Specialty Chemicals (product name) etc.; alicyclic epoxy resins including Celoxide 2021 manufactured by Daicel Chemical Industries, Ltd., Araldite CY175 and CY179 manufactured by Ciba Specialty Chemicals (all, product names) etc.;

trihydroxyphenyl methane-type epoxy resins including YL-933 manufactured by Japan Epoxy Resins Co., Ltd., T.E.N., EPPN-501 and EPPN-502 manufactured by Dow Chemical Company (all, product names) etc.; bixylenol-type or biphenol-type epoxy resins including YL-6056, YX-4000 and YL-6121 manufactured by Japan Epoxy Resins Co., Ltd. (all, product names) etc. or the mixtures thereof;

bisphenol S-type epoxy resins including EBPS-200 manufactured by Nippon Kayaku Co., Ltd., EPX-30 manufactured by Adeka Corporation, EXA-1514 manufactured by Dainippon Ink and Chemicals Inc. (product name) etc.;

bisphenol A novolac type epoxy resins including Epikote 157S manufactured by Japan Epoxy Resins Co., Ltd. (product name) etc.;

tetraphenylol ethane-type epoxy resins including Epikote YL-931 manufactured by Japan Epoxy Resins Co., Ltd., Araldite 163 manufactured by Ciba Specialty Chemicals (all, product names) etc.; heterocyclic epoxy resins including Araldite PT810 manufactured by Ciba Specialty Chemicals, TEPIC manufactured by Nissan Chemical Industries, Ltd. (all, product names) etc.;

diglycidyl phthalate resins including Blemmer DGT manufactured by NOF Corporation etc.;

tetraglycidyl xylenoyl ethane resins including ZX-1063 manufactured by Tohto Kasei Co., Ltd., etc.; naphthalene group-containing epoxy resins including ESN-190 and ESN-360 manufactured by Nippon Steel Chemical Co., Ltd. HP-4032, EXA-4750 and EXA-4700 manufactured by Dainippon Ink and Chemicals Inc., etc.; dicyclopentadiene skeleton-containing epoxy resins including HP-7200 and HP-7200H manufactured by Dainippon Ink and Chemicals Inc., etc.; glycidyl methacrylate-copolymerized epoxy resins including CP-50S and CP-50M manufactured by NOF Corporation etc.; epoxy resins prepared by copolymerization of cyclohexylmaleimide and glycidyl methacrylate; epoxy-modified polybutadiene rubber derivatives (e.g., PB-3600 manufactured by Daicel Chemical Industries, Ltd. etc.), CTBN-modified epoxy resins (e.g., YR-102 and YR-450 manufactured by Tohto Kasei Co., Ltd. etc.), and the like. These epoxy resins may be used alone or in combination of two or more. Particularly favorable among them are novolac-type epoxy resins, heterocyclic epoxy resins, bisphenol A-type epoxy resins and mixtures thereof.

Examples of the multifunctional oxetane compounds (D-2) include multifunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl) methyl acrylate, (3-ethyl-3-oxetanyl)methyl acrylate, (3-methyl-3-oxetanyl)methyl methacrylate, (3-ethyl-3-oxetanyl)methyl methacrylate and the oligomer or copolymers thereof; etherification products of oxetane and a hydroxyl group-containing resin such as novolac resin, poly(p-hydroxystyrene), cardobisphenol, calixarene, calixresorcinarene or silsesquioxane; and the like. Other examples include copolymers of an oxetane ring-containing unsaturated monomer and an alkyl (meth)acrylate.

Examples of the compound having two or more cyclic thioether groups in the molecule include the bisphenol A-type episulfide resin YL7000 manufactured by Japan Epoxy Resins Co., Ltd., and the like. The episulfide resins obtained by replacing the oxygen atoms of the epoxy groups of novolac-type epoxy resins with sulfur atoms by a similar synthetic method can also be used.

The content of the cyclic (thio)ether compound is in the range of 0.6 to 2.0 equivalences, preferably, 0.8 to 1.5 equivalences, as cyclic (thio)ether group, with respect to 1 equivalence of the carboxyl group in the carboxyl group-containing photosensitive resin (A). A cyclic (thio)ether compound content of lower than the range above unfavorably leads to residual of carboxyl groups and deterioration in heat resistance, alkali resistance, electric insulating property, etc. Alternatively, a content of more than the range above leads to residual of the low-molecular weight cyclic (thio)ether group and deterioration for example in film strength, and is thus unfavorable.

When the cyclic (thio)ether compound is used, a thermosetting catalyst is preferably contained. Examples of the thermosetting catalysts include imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic hydrazide and sebacic hydrazide; phosphorus compounds such as triphenylphosphine, and the like, and commercially available products include 2MZ-A, 2MZ-OK, 2PHZ, 2P4BHZ and 2P4 MHZ manufactured by Shikoku Chemicals Corporation. (all, product names of imidazole compounds), U-CAT3503N and U-CAT3502T manufactured by SAN-APRO (both: trade names of dimethylamine block isocyanate compounds), DBU, DBN, U-CATSA102, and U-CAT5002 (all, bicyclic amidine compounds and the salts thereof), and the like. In addition to the examples above, any compounds, alone or in combination of two or more, may be used, if they accelerate the hardening reaction of the epoxy resin or the oxetane compound in the presence of a thermosetting catalyst or the reaction of the epoxy group and/or the oxetanyl group with the carboxyl group. Alternatively, an S-triazine derivative, such as guanamine, acetoguanamine, benzoguanamine, melamine, 2,4-diamino-6-methacryloyloxyethyl-S-triazine, 2-vinyl-4,6-diamino-S-triazine, 2-vinyl-4,6-diamino-S-triazine isocyanuric acid adduct, 2,4-diamino-6-methacryloyloxyethyl-S-triazine isocyanuric acid adduct, which functions as an adhesiveness enhancer, may be used, and the compound functioning also as an adhesiveness enhancer is preferably used in combination with the thermosetting catalyst above.

The blending rate of the thermosetting catalyst is normally a standard amount, and specifically, 0.1 to 20 parts by mass, preferably 0.5 to 15.0 parts by mass, with respect to 100 parts by mass of the carboxyl group-containing resin (A) or of the thermally hardening component.

At least one sensitizer (E) selected from the group consisting of thioxanthone-based sensitizers, coumarin-based sensitizers, alkylaminobenzophenone-based sensitizers, which is characteristically used in the second embodiment of the present invention, is used for improvement in sensitivity to the laser beam at a maximum wavelength of 400 to 410 nm. These sensitizers may be used alone or in combination of two or more.

Examples of the thioxanthone-based sensitizers (including photopolymerization initiators) include 2,4-dimethylthioxanthone, 2,4-diethylthioxanthone, 2-chlorothioxanthone, 2-isopropylthioxanthone, and 2,4-diisopropylthioxanthone.

The coumarin-based sensitizer is particularly preferably a nitrogen-containing coumarin-based sensitizer having the structure represented by the following Formula (VIII):

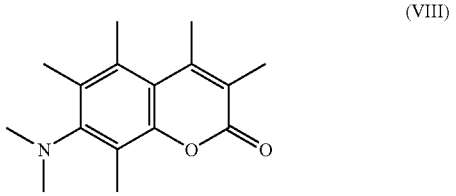
(VIII)

and particularly favorable are the compounds represented by the following Formulae (IX) to (XII):

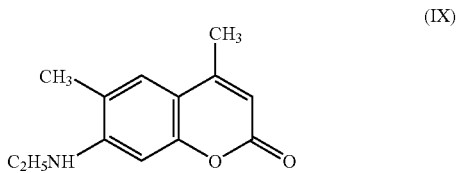
(IX)

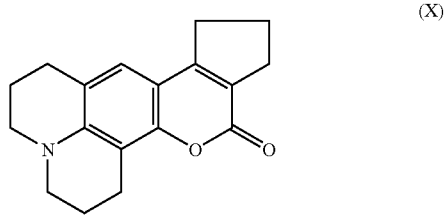
(X)

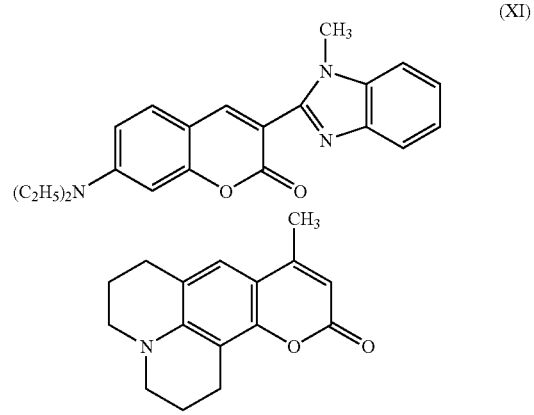
(XI)

and the compound represented by the following Formula (XIII):

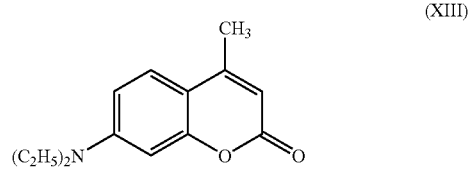
(XIII)

(7-(diethylamino)-4-methyl-2H-1-benzopyran-2-one), and among them, the coumarin-based sensitizer represented by Formula (XIII) is most preferable.

Examples of the alkylaminobenzophenone-based sensitizers (including photopolymerization initiators) include 4,4'-dimethylaminobenzophenone (Nissocure MABP manufactured by Nippon Soda Co., Ltd.), 4,4'-diethylaminobenzophenone (EAB manufactured by Hodogaya Chemical Co., Ltd.) and the like.

As for the content of the sensitizer (E), the total amount of the oxime-based photopolymerization initiator (B) described above, the aminoacetophenone-based photopolymerization initiator (F) and the acylphosphine oxide-based photopolymerization initiator (G) described below is in the range of 35 part or less by mass with respect to 100 parts by mass of the carboxyl group-containing photosensitive resin (A). The total amount of above the range may unfavorably lead to deterioration in in-depth hardenability, because of light absorption by the compounds.

When a composition containing a coloring pigment described below is used, the dry coated film thereof preferably has an absorbance per 25 μm of the film thickness of 0.3 to 1.5, more preferably 0.4 to 1.2, at a wavelength of 405 nm. An absorbance above the range undesirably leads to deterioration in in-depth hardenability because of light absorption by the pigment.

For stabilized photohardening efficiency, the alkali development-type solder resist according to the present invention preferably contains, in addition to the oxime ester-based photopolymerization initiator (B) and/or the sensitizer (E), (F) an aminoacetophenone-based photopolymerization initiator having the structure represented by the following General Formula (III):

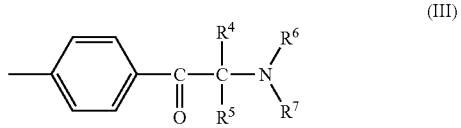

(wherein, $R^4$ and $R^5$ each represent an alkyl or aryl alkyl group having 1 to 12 carbon atoms; and $R^6$ and $R^7$ each represent a hydrogen atom, an alkyl group having 1 to 6 carbon atoms or jointly represent a cyclic alkyl group)

or (G) an acylphosphine oxide-based photopolymerization initiator represented by the following General Formula (IV):

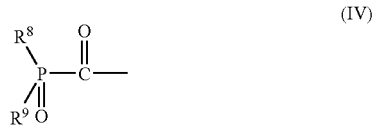

(wherein, $R^8$ and $R^9$ each represent a straight-chain or branched alkyl group having 1 to 6 carbon atoms, a cyclohexyl group, a cyclopentyl group, an aryl group, or an aryl group substituted with a halogen atom, an alkyl group or an alkoxy group, or one of them represents a carbonyl group having 1 to 20 carbon atoms), or both of them.

Examples of the aminoacetophenone-based photopolymerization initiator (F) having the structure represented by the General Formula (III) include 2-methyl-1-[4-(methylthio)phenyl]-2-morpholinoaminopropanone-1, 2-benzyl-2-dimethylamino-1-(4-morpholino phenyl)-butan-1-one, 2-(dimethylamino)-2-[(4-methylphenyl)methyl]-1-[4-(4-morpholinyl) phenyl]-1-butanone, N,N-dimethylaminoacetophenone and the like. Commercially available products thereof include Irgacure-907, Irgacure-369 and Irgacure-379 manufactured by Ciba Specialty Chemicals, and the like.

Examples of the acylphosphine oxide-based photopolymerization initiators (G) represented by the General Formula (IV) include 2,4,6-trimethylbenzoyldiphenylphosphine oxide, bis(2,4,6-trimethylbenzoyl)-phenylphosphine oxide, bis(2,6-dimethoxybenzoyl)-2,4,4-trimethyl-pentylphosphine oxide and the like. Commercial products thereof include Lucirin TPO manufactured by BASF, Irgacure-819 manufactured by Ciba Specialty Chemicals, and the like.

As for the contents of the aminoacetophenone-based photopolymerization initiator (F) and the acylphosphine oxide-based photopolymerization initiator (G), the total content with the oxime ester-based photopolymerization initiator (B) described above is in the range of 0.05 to 30 parts by mass, preferably 0.5 to 15 parts by mass, with respect to 100 parts by mass of the carboxyl group-containing photosensitive resin (A), and the total content including the coloring pigment etc. described below is in the range of 0.3 to 1.2, preferably 0.4 to 1.2, as absorbance per 25 μm of the film thickness of the drying film at a wavelength of 355 nm in the case of the first embodiment. In the case of the second embodiment, the absorbance per 25 μm of the film thickness at a wavelength of 405 mm of the composition including (E) the at least one sensitizer selected from the group consisting of thioxanthone-based sensitizers, coumarin-based sensitizers and alkylaminobenzophenone-based sensitizers is in the range of 0.3 to 1.2, preferably 0.4 to 1.2.

The alkali development-type solder resist according to the present invention may contain, as needed additionally, in the range above, one or more of commonly known photopolymerization initiators, including benzoin and benzoin alkyl ethers such as benzoin, benzoin methylether, benzoin ethylether, and benzoin isopropylether; acetophenones such as acetophenone, 2,2-dimethoxy-2-phenylacetophenone, 2,2-diethoxy-2-phenylacetophenone, and 1,1-dichloroacetophenone; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyldimethyl ketal; benzophenones or xanthones such as benzophenone, 4-benzoyldiphenylsulfide, 4-benzoyl-4'-methyldiphenylsulfide, 4-benzoyl-4'-ethyldiphenylsulfide, and 4-benzoyl-4'-propyldiphenylsulfide; and the like. In particular, combined use of a thioxanthone compound such as 2,4-dimethylthioxanthone, 2,4-diethylthioxanthone, 2-chlorothioxanthone, or 2,4-diisopropylthioxanthone is favorable from the point of in-depth hardening efficiency.

The composition may contain a photoinitiator aid additionally in the range of the photopolymerization initiator. Examples of the photoinitiator aids include tertiary amine compounds and benzophenone compounds. Typical examples thereof include ethanolamines; dialkylaminobenzophenones such as 4,4'-dimethylaminobenzophenone (Nissocure-MABP manufactured by Nippon Soda Co., Ltd.) and 4,4'-diethylaminobenzophenone (EAB manufactured by Hodogaya Chemical Co., Ltd.); ethyl 4-dimethylaminobenzoate (Kayacure EPA manufactured by Nippon Kayaku Co., Ltd.), ethyl 2-dimethylaminobenzoate (Quantacure DMB manufactured by International Bio-Synthetics), (n-butoxy) ethyl 4-dimethylaminobenzoate (Quantacure BEA manufactured by International Bio-Synthetics), isoamylethyl p-dimethylaminobenzoate ester (Kayacure DMBI manufactured by Nippon Kayaku Co., Ltd.), 2-ethylhexyl 4-dimethylaminobenzoate (Esolol 507 manufactured by Van Dyk) and the like. These known tertiary amine compounds may be used alone or in combination of two or more.

Particularly preferable tertiary amine compounds include dialkylaminobenzophenones such as 4,4'-dimethylaminobenzophenone and 4,4'-diethylaminobenzophenone. These compounds may be used alone or in combination of two or more.

The alkali development-type solder resist according to the present invention preferably contains (H) a filler for improvement in the strength and electrical properties of the hardened film.

Any known inorganic or organic filler may be used as the filler (H), but use of barium sulfate or spherical silica is particularly preferable. Other favorable examples thereof include a dispersion of nano silica in the compound having two or more ethylenic unsaturated groups (D) described above or the multifunctional epoxy resin (D-1) described above, such as NANOCRYL (trade name) XP0396, XP0596, XP0733, XP0746, XP0765, XP0768, XP0953, XP0954, and XP1045 (product grade name) manufactured by Hanse Chemie and NANOPOX (trade name) XP0516, XP0525, and XP0314 (product grade name) manufactured by Hanse Chemie.

These compounds may be blended alone or in combination of two or more. These fillers are used for the purpose of controlling hardening shrinkage of the coated film and improving the basic properties such as adhesiveness and hardness of the film, and also for reducing disturbance for example of light reflection or refraction during transmission of the high-energy ray through the alkali development-type solder resist.

The blending rate of the filler (H) is preferably 0.1 to 300 parts by mass, more preferably, 0.1 to 150 parts by mass, with respect to 100 parts by mass of the carboxyl group-containing photosensitive resin (A). A filler (H) blending rate of less than 0.1 parts by mass unfavorably leads to deterioration in hardened film properties such as solder heat resistance and gold-plating resistance. On the other hand, a blending rate of more than 300 parts by mass unfavorably leads to increase in viscosity of the composition and thus to deterioration in printability and increase in brittleness of the cured product.

The alkali development-type solder resist according to the present invention may use an organic solvent additionally for preparation of the carboxyl group-containing photosensitive resin (A) and adjustment of the composition, or for adjustment of the viscosity for application thereof on a substrate or carrier film.

Examples of the organic solvents include ketones, aromatic hydrocarbons, glycol ethers, glycol ether acetates, esters, alcohols, aliphatic hydrocarbons, petroleum solvents, and the like. More specific examples thereof include ketones such as methylethylketone and cyclohexanone; aromatic hydrocarbons such as toluene, xylene and tetramethylbenzene; glycol ethers such as cellosolve, methyl cellosolve, butyl cellosolve, carbitol, methyl carbitol, butyl carbitol, propylene glycol monomethylether, dipropylene glycol monomethylether, dipropylene glycol diethylether, and triethylene glycol monoethylether; glycol ether acetates such as dipropylene glycol methylether acetate, propylene glycol methylether acetate, propylene glycol ethylether acetate, and propylene glycol butylether acetate; esters including acetate esters such as ethyl acetate, butyl acetate and the glycol ethers; alcohols such as ethanol, propanol, ethylene glycol, and propylene glycol; aliphatic hydrocarbons such as octane and decane; petroleum solvents such as petroleum ether, petroleum naphtha, hydrogenated petroleum naphtha, and solvent naphtha; and the like.

The organic solvents above may be used alone or as a mixture of two or more solvents.

The alkali development-type solder resist according to the present invention may contain as needed other known additives, including known colorants such as phthalocyanine-blue, phthalocyanine-green, iodine green, disazo yellow, crystal violet, titanium oxide, carbon black, and naphthalene black; common thermal polymerization inhibitors such as hydroquinone, hydroquinone monomethylether, t-butylcatechol, pyrogallol and phenothiazine; known thickeners such as fine powder silica, organic bentonite and montmorillonite; antifoaming agents and/or leveling agents such as those based on silicone, fluorine and polymer; imidazole-, thiazole-, and triazole-based adhesiveness imparting agents and other silane-coupling agents; and the like.

It is possible to form a tack-free film of the alkali development-type solder resist according to the present invention, for example, by preparing a coating solution with a viscosity suitable for production with the organic solvent described above, applying the solution on a base material, for example, by dip coating, flow coating, roll coating, bar coater, screen printing, curtain coating, or the like, drying the composition while vaporizing the organic solvent at a temperature of approximately 60 to 100° C. (predrying). It is also possible to form a resin insulation layer by coating the composition on a carrier film, drying the composition, winding the resulting film, and transferring the film onto a base material. Then, a resist pattern is formed by exposing the film through a patterned photomask selectively to a high-energy ray in a contact mode (or in a non-contact mode) and developing the light-unexposed region with a dilute aqueous alkaline solution (e.g., 0.3 to 3% aqueous sodium carbonate solution). It is possible to form a hardened film superior in various properties such as heat resistance, chemical resistance, moisture resistance, adhesiveness, and electrical properties, for example by hardening the film under heat at a temperature of approximately 140 to 180° C., i.e., in reaction of the carboxyl groups in the carboxyl group-containing photosensitive resin (A) for example with the thermosetting component (D) in the cyclic (thio)ether compound.

Examples of the base materials include copper-clad laminates of all grades (FR-4, etc.), for example high-frequency-circuit copper-clad laminates employing paper phenol, paper epoxy, glass cloth epoxy, glass polyimide, glass cloth/non-woven fabric epoxy, glass cloth/paper epoxy, synthetic fiber epoxy, fluorine-polyethylene-PPO-cyanate ester, or the like, as well as polyimide film, PET film, glass plate, ceramic substrate, wafer plate, and the like.

After application, the alkali development-type solder resist according to the present invention is vaporized and dried, for example, by using a hot air-circulation drying oven, IR oven, hot plate, or convection oven (by a method of using a heat source for heating air by steam and bringing the hot air in the dryer into contact with the film in the counter-current flow manner or spraying the heated air onto the film through a nozzle).

The film obtained after application and vaporization drying of the photocurable resin composition according to the present invention is then exposed to light (high-energy ray irradiation). The film hardens in the light-exposed region (region irradiated with the high-energy ray).

A direct imaging apparatus (e.g., direct laser-imaging apparatus drawing an image with a laser directly according to CAD data from a computer) may be used directly as the exposure machine for high-energy ray irradiation. The high-energy ray may be either a gas- or solid-state laser, provided it is a laser beam having a maximum wavelength in the range of 350 to 375 nm. The irradiation intensity may vary according to the thickness etc. of the film, but is generally in the range of 5 to 200 mJ/cm$^2$, preferably 5 to 100 mJ/cm$^2$, and more preferably 5 to 50 mJ/cm$^2$. Examples of the direct imaging apparatuses include products manufactured by Orbotech Japan, Pentax Corp., etc., and any one of them may be used, provided it is an apparatus emitting a laser beam at a maximum wavelength of 350 to 375 nm or 400 to 410 nm.

The development method may be an immersion, showering, spraying, brushing or other method, and an aqueous alkaline solution for example of potassium hydroxide, sodium hydroxide, sodium carbonate, potassium carbonate, sodium phosphate, sodium silicate, ammonia, or an amine is used as the developing solution.

EXAMPLES

Hereinafter, the present invention will be described in detail with reference to Examples and Comparative Examples, but it should be understood that the present invention is not limited to the following Examples.

Preparative Example 1

In a 2-liter separable flask equipped with a stirrer, a thermometer, a condenser tube and a dropping funnel, placed are 440 g (2.0 equivalences) of a cresol novolac-type epoxy resin (EOCN-104S manufactured by Nippon Kayaku Co., Ltd., softening point: 92° C., epoxy equivalence: 220) and 345 g of carbitol acetate, and the mixture was agitated under heat at 90° C. for solubilization. The mixture was then cooled to 80° C.; and 144.0 g (2.0 equivalences) of acrylic acid, 2.0 g of triphenylphosphine, and 0.8 g of methylhydroquinone were added thereto; and the mixture was reacted at 90 to 95° C. for 16 hours, to give a reaction product having an acid value of 1.6 mg-KOH/g. 273.6 g (1.8 equivalences) of tetrahydrophthalic anhydride was added thereto, and the mixture was reacted at 90° C. for 8 hours. 241.4 g (1.7 equivalences) of glycidyl methacrylate was added to the reaction solution and reacted at 90 to 95° C. for 12 hours, and additionally with 182.4 g (1.2 equivalences) of tetrahydrophthalic anhydride. Finally, 345 g of an aromatic solvent Ipzole #150 manufactured by Idemitsu Kosan was added thereto for viscosity adjustment, and the mixture was mixed and agitated before isolation.

The solution of the carboxyl group-containing photosensitive resin (A) according to the present invention solution thus obtained had an acid value (as solid matter) of 56.9 mg-KOH/g, a double bond equivalent (as solid matter) of 346.3, and a nonvolatile matter content of 65.1 mass %. Hereinafter, the carboxyl group-containing photosensitive resin solution will be referred to as A-1 varnish.

Preparative Example 2

In a 2-liter separable flask equipped with a stirrer, a thermometer, a condenser tube and a dropping funnel, placed are 440 g (2.0 equivalences) of a cresol novolac-type epoxy resin (EOCN-104S manufactured by Nippon Kayaku Co., Ltd., softening point: 92° C., epoxy equivalent: 220) and 394 g of carbitol acetate, and the mixture was agitated under heat at 90° C. for solubilization. The mixture was then cooled to 80° C.; and 115.2 g (1.6 equivalences) of acrylic acid, 86.4 g (0.4 equivalence) of ε-caprolactone-modified acrylic acid manufactured by Toagosei Co., Ltd., 2.0 g of triphenylphosphine, and 0.8 g of methylhydroquinone were added thereto; and the mixture was reacted at 90 to 95° C. for 18 hours, to give a reaction product having an acid value of 1.8 mg-KOH/g. 273.6 g (1.8 equivalences) of tetrahydrophthalic anhydride was added thereto, and the mixture was reacted at 90° C. for 8 hours. 241.4 g (1.7 equivalences) of glycidyl methacrylate was added to the reaction solution and reacted at 90 to 95° C. for 12 hours, and additionally with 182.4 g (1.2 equivalences) of tetrahydrophthalic anhydride. Finally, 394 g of an aromatic solvent Ipzole #150 manufactured by Idemitsu Kosan was added thereto for viscosity adjustment, and the mixture was mixed and agitated before isolation.

The solution of the carboxyl group-containing photosensitive resin (A) according to the present invention solution thus obtained had an acid value (as solid matter) of 54.5 mg-KOH/g, a double bond equivalent (as solid matter) of 361.9, and a nonvolatile matter content of 63.0 mass %. Hereinafter, the carboxyl group-containing photosensitive resin solution will be referred to as A-2 varnish.

Preparative Example 3

In a 2-liter separable flask equipped with a stirrer, a thermometer, a condenser tube and a dropping funnel, placed are 440 g (2.0 equivalences) of a cresol novolac-type epoxy resin (EOCN-104S manufactured by Nippon Kayaku Co., Ltd., softening point: 92° C., epoxy equivalent: 220) and 310 g of carbitol acetate, and the mixture was agitated under heat at 90° C. for solubilization. The mixture was then cooled to 80° C.; and 86.4 g (1.2 equivalences) of acrylic acid, 172.8 g (0.8 equivalence) of ε-caprolactone-modified acrylic acid manufactured by Toagosei Co., Ltd., 3.0 g of triphenylphosphine, and 0.8 g of methylhydroquinone were added thereto; and the mixture was reacted at 90 to 95° C. for 18 hours, to give a reaction product having an acid value of 2.1 mg-KOH/g. 273.6 g (1.8 equivalences) of tetrahydrophthalic anhydride was added thereto, and the mixture was reacted at 90° C. for 8 hours. 127.8 g (0.8 equivalences) of glycidyl methacrylate was added to the reaction solution and reacted at 90 to 95° C. for 16 hours. Finally, 310 g of an aromatic solvent Ipzole #150 manufactured by Idemitsu Kosan was added thereto for viscosity adjustment, and the mixture was mixed and agitated before isolation.

The solution of the carboxyl group-containing photosensitive resin (A) according to the present invention solution thus obtained had an acid value (as solid matter) of 51.7 mg-KOH/g, a double bond equivalent (as solid matter) of 388.0, and a nonvolatile matter content of 63.6 mass %. Hereinafter, the carboxyl group-containing photosensitive resin solution will be referred to as A-3 varnish.

Comparative Preparative Example 1

In a 2-liter separable flask equipped with a stirrer, a thermometer, a condenser tube and a dropping funnel, placed are 430 g (2.0 equivalences) of an O-cresol novolac-type epoxy resin (Epichlone N-680 manufactured by Dainippon Ink and Chemicals, Inc., epoxy equivalent: 215) and 200 g of carbitol acetate; and the mixture was agitated under heat at 90° C. for solubilization. The mixture was then cooled to 80° C.; 144 g (2.0 equivalences) of acrylic acid, 2.0 g of triphenylphosphine, and 0.8 g of methylhydroquinone were added thereto; the mixture was reacted at 90 to 95° C. for 16 hours, to give a reaction product having an acid value of 0.6 mg-KOH/g. 167.2 g (1.1 equivalences) of tetrahydrophthalic anhydride was added thereto, and the mixture was reacted at 90° C. for 8 hours. Finally, 200 g of an aromatic solvent Ipzole #150 manufactured by Idemitsu Kosan was added thereto for viscosity adjustment, and the mixture was mixed and agitated before isolation.

The solution of the carboxyl group-containing photosensitive resin thus obtained had an acid value (as solid matter) of 41.8 mg-KOH/g, a double bond equivalent (as solid matter) of 741.2, and a nonvolatile matter content of 65.1 mass %. Hereinafter, the carboxyl group-containing photosensitive resin solution will be referred to as R-1 varnish.

Each of the carboxyl group-containing resin solutions obtained in Preparative Examples 1 to 3 and Comparative Preparative Example 1 was blended with various components at the component rates (parts by mass) shown in Tables 1-1 and 1-2, premixed with a stirrer and then blended with a three-roll mill, to give an alkali development-type solder resist. The degree of dispersion of the photosensitive resin composition obtained, as determined by using a grindmeter manufactured by Erichsen, was 15 μm or less.

Table 1-1 shows the results obtained in the first embodiment of the present invention that demands components (A) to (D) as essential components, while Table 1-2 shows the results obtained in the second embodiment that demands components (A) to (E) as essential components.

TABLE 1-1

|  | Exam. |  |  |  |  |  |  | Comp. |  |  |  |
|---|---|---|---|---|---|---|---|---|---|---|---|
|  | 1 | 2 | 3 | 4 | 5 | 6 | 7 | 1 | 2 | 3 | 4 |
| A-1 Varnish | 155 | — | — | — | — | — | — | — | — | — | — |
| A-2 Varnish | — | 155 | 155 | 155 | 155 | 155 | — | 155 | 155 | 155 | — |
| A-3 Varnish | — | — | — | — | — | — | 155 | — | — | — | — |
| R-1 Varnish | — | — | — | — | — | — | — | — | — | — | 155 |
| Photopolymerization initiator(B-1) *[1] | 1 | 1 | 0.5 | — | 1 | — | 1 | — | 0.5 | — | 1 |

TABLE 1-1-continued

|  | Exam. |  |  |  |  |  |  | Comp. |  |  |  |
|---|---|---|---|---|---|---|---|---|---|---|---|
|  | 1 | 2 | 3 | 4 | 5 | 6 | 7 | 1 | 2 | 3 | 4 |
| Photopolymerization initiator(B-2) *2 | — | — | 0.5 | — | — | — | — | — | — | — | — |
| Photopolymerization initiator(B-3) *3 | — | 0.5 | — | 1 | — | 1 | — | 3 | — | — | — |
| Photopolymerization initiator(E-1) *4 | 6 | — | — | — | 6 | — | 6 | — | 6 | — | 6 |
| Photopolymerization initiator(F-1) *5 | — | — | — | — | — | 10 | — | 10 | — | 15 | — |
| Phthalocyanine-blue | 0.3 | — | 0.3 | 0.3 | 0.3 | 0.3 | 0.3 | 0.3 | — | 0.3 | 0.3 |
| Anthraquinone-based yellow pigment | 0.7 | 0.7 | 0.7 | 0.7 | 0.7 | 0.7 | 0.7 | 0.7 | 0.7 | 0.7 | 0.7 |
| Compound(C-1) *6 | 20 | 20 | 20 | 20 | 20 | 20 | 20 | 20 | 20 | 20 | 20 |
| Compound(C-2) *7 | 10 | 10 | 10 | 10 | 10 | 10 | 10 | 10 | 10 | 10 | 10 |
| Filler(G-1) *8 | 130 | 130 | 130 | 130 | 130 | 130 | 130 | 130 | 130 | 130 | 130 |
| Thermosetting component(D-1-1) *9 | 15 | 15 | 15 | 15 | 15 | 15 | 15 | 15 | 15 | 15 | 15 |
| Thermosetting component(D-1-2) *10 | 30 | 30 | 30 | 30 | 30 | 30 | 30 | 30 | 30 | 30 | 30 |
| Fine melamine | 3 | 3 | 3 | 3 | 3 | 3 | 3 | 3 | 3 | 3 | 3 |
| Silicone antifoaming agent | 3 | 3 | 3 | 3 | 3 | 3 | 3 | 3 | 3 | 3 | 3 |
| DPM*11 | 5 | 5 | 5 | 5 | 5 | 5 | 5 | 5 | 5 | 5 | 5 |

Remarks
*1 2-(acetyloxyiminomethyl)thioxanthen-9-one
*2 1,2-octandione, 1-[4-(phenylthio)-, 2-(O-benzoyloxime)
*3 Ethanone, 1-[9-ethyl-6-(2-methylbenzoyl)-9H-carbazol-3-yl]-, 1-(O-acetyloxime)
*4 2-methyl-1-[4-(methylthio)phenyl]-2-morpholinoaminopropanone-1
*5 Bis(2,4,6-trimethylbenzoyl)-phenylphosphineoxide
*6 Dipentaerythritol hexa-acrylate
*7 Trimethylolpropane tri-acrtlate
*8 Barium sulfate (B-30 manufactured by Sakai Chemical Industry Co., Ltd.)
*9 Phenol novolak epoxy resin (EPPN-201 manufactured by Nippon Kayaku Co., Ltd.)
*10 Bixylenol epoxy resin (YX-4000 manufactured by Japan Epoxy Resin Co., Ltd.)
*11 Dipropylene glycol methylether acetate.

TABLE 1-2

|  | Exam. |  |  | Comp. |  |  |  |
|---|---|---|---|---|---|---|---|
|  | 8 | 9 | 10 | 5 | 6 | 7 | 8 |
| A-1 Varnish | — | — | — | — | — | — | — |
| A-2 Varnish | 155 | 155 | 155 | 155 | 155 | 155 | — |
| A-3 Varnish | — | — | — | — | — | — | — |
| R-1 Varnish | — | — | — | — | — | — | 155 |
| Photopolymerization initiator(B-1) *1 | 3 | 3 | 3 | 5 | 1 | — | 3 |
| Photopolymerization initiator(B-2) *2 | — | 1 | — | — | — | — | — |
| Photopolymerization initiator(B-3) *3 | 1 | — | — | — | — | — | — |
| Sensitizer(E-1) *4 | 1 | 0.5 | — | 2 | — | 1 | — |
| Sensitizer(E-2) *5 | — | — | 0.5 | 1 | — | — | 0.5 |
| Sensitizer(E-3) *6 | — | — | 1.2 | — | — | — | 1.2 |
| Photopolymerization initiator(F-1) *7 | — | — | 6 | — | 6 | — | 6 |
| Photopolymerization initiator(G-1) *8 | — | — | — | — | — | 6 | — |
| Phthalocyanine-blue | — | 0.9 | 0.9 | 0.9 | — | 0.9 | 0.9 |
| Anthraquinone-based yellow pigment | — | — | 1.0 | 1.0 | — | — | 1.0 |
| Compound(C-1) *9 | 20 | 20 | 20 | 20 | 20 | 20 | 20 |
| Compound(C-2) *10 | 10 | 10 | 10 | 10 | 10 | 10 | 10 |
| Filler(G-1) *11 | 130 | 130 | 130 | 130 | 130 | 130 | 130 |
| Thermosetting component(D-1-1) *12 | 15 | 15 | 15 | 15 | 15 | 15 | 15 |
| Thermosetting component(D-1-2) *13 | 30 | 30 | 30 | 30 | 30 | 30 | 30 |
| Fine melamine | 3 | 3 | 3 | 3 | 3 | 3 | 3 |
| Silicone antifoaming agent | 3 | 3 | 3 | 3 | 3 | 3 | 3 |
| DPM *14 | 5 | 5 | 5 | 5 | 5 | 5 | 5 |

Remarks
*1 2-(acetyloxyiminomethyl)thioxanthen-9-one
*2 1,2-octandione, 1-[4-(phenylthio)-, 2-(O-benzoyloxime)
*3 Ethanone, 1-[9-ethyl-6-(2-methylbenzoyl)-9H-carbazol-3-yl]-, 1-(O-acetyloxime)
*4 7-(diethylamino)-4-methyl-2H-1-benzopyran-2-one
*5 4,4'-diethylaminobenzophenone
*6 2,4-diethylthioxanthone
*7 2-methyl-1-[4-(methylthio)phenyl]-2-morpholinoaminopropanone-1
*8 Bis(2,4,6-trimethylbenzoyl)-phenylphosphineoxide
*9 Dipentaerythritol hexa-acrylate
*10 Trimethylolpropane tri-acrtlate
*11 Barium sulfate (B-30 manufactured by Sakai Chemical Industry Co., Ltd.)
*12 Phenol novolak epoxy resin (EPPN-201 manufactured by Nippon Kayaku Co., Ltd.)
*13 Bixylenol epoxy resin (YX-4000 manufactured by Japan Epoxy Resin Co., Ltd.)
*14 Dipropylene glycol methylether acetate.

Evaluation of Properties:
<Surface Hardenability>

Each of the alkali development-type solder resists thus prepared in the Examples and the Comparative Examples above was applied by screen printing on a substrate carrying a circuit pattern having a line/space ratio of 300/300 and having a copper thickness of 35 μm, which was previously polished with buff rolls, washed with water, and dried, and the film was dried in a hot air-circulating drying oven at 80° C. for 60 minutes. After drying, each of the resists obtained in Examples and Comparative Examples shown in Table 1-1 was exposed to light in a direct imaging apparatus emitting a semiconductor laser at a maximum wavelength of 350 to 375 nm, while each of the resists obtained in the Examples and Comparative Examples shown in Table 1-2 was exposed to light in a direct imaging apparatus emitting a semiconductor laser at a maximum wavelength of 400 to 410 nm. The exposure pattern used was an entire-surface exposure pattern. The high-energy ray was irradiated such that the irradiation intensity on the photo- and heat-hardening resin composition was 40 mJ/cm². After exposure, the substrate was developed (30° C., 0.2 MPa, 1 wt % aqueous sodium carbonate solution) for 60 seconds, giving a developed pattern, which was then hardened thermally at 150° C. for 60 minutes, to give a hardened film.

The surface hardenability of the hardened film thus obtained was evaluated by measuring the glossiness at the 60° angle by using a glossimeter MicroTrigloss (manufactured by Big Gardener). As for the evaluation criteria, a glossiness of 50 or more after development was rated favorable and a glossiness of less than 50, unfavorable. The evaluation results of the resists in Table 1-1 are summarized in Table 2-1, while those of Table 1-2 in Table 2-2.

<Cross-Sectional Shape>

Each of the alkali development-type solder resists obtained in Examples and Comparative Examples above was applied by screen printing on a substrate carrying a circuit pattern having a line/space ratio of 300/300 and having a copper thickness of 35 μm, which was previously polished with buff rolls, washed with water, and dried, and the film was dried in a hot air-circulating drying oven at 80° C. for 30 minutes. After drying, each of the samples obtained in the Examples and Comparative Examples shown in Table 1-1 was exposed to light in a direct imaging apparatus emitting a semiconductor laser at a maximum wavelength 350 to 375 nm, and that of the samples in Table 1-2, in a direct imaging apparatus emitting a semiconductor laser at a maximum wavelength of 400 to 410 nm. The exposure pattern used was a pattern having lines of 20, 30, 40, 50, 60, 70, 80, 90 and 100 μm in width in the space area. The irradiation intensity used was the irradiation intensity obtained by evaluation of the optimal irradiation intensity below. After photoirradiation, a pattern is formed by development with an aqueous sodium carbonate solution, irradiated with UV by a high-pressure mercury lamp at an intensity of 1,000 mJ/cm², and hardened at 150° C. for 60 minutes, to give a hardened film. The cross section of a designed 100-μm line region of the hardened film was observed.

The shapes were grouped into five ranks, A to E, respectively corresponding to the schematic views shown in FIGURE. FIGURE shows schematic views when the following phenomenon occurs. In particular at the rank A, the deviation in line width from the design value is not larger than 5 μm at the top or bottom of the line. The results are summarized in Tables 2-1 and 2-2.

Rank A: Ideal state with designed width
Rank B: Corrosion of surface layer, for example, by insufficient development resistance
Rank C: Undercut state
Rank D: Line thickening for example by halation
Rank E: Line thickening of surface layer and undercut <Optimal Irradiation Intensity>

Each of the alkali development-type solder resists obtained in the Examples and Comparative Examples above was coated on the entire surface of a test substrate by screen printing. After drying in a hot air-circulating drier, a negative pattern with lines of 50 to 130 μm in width was placed on the film, and the film was exposed to light directly in an image-forming apparatus emitting a semiconductor laser light at a maximum wavelength of 350 to 375 in the case of the samples of the Examples and Comparative Examples shown in Table 1-1, while in a direct imaging apparatus emitting a semiconductor laser light at a maximum wavelength 400 to 410 nm in the case of the samples of the Examples and Comparative Examples shown in Table 1-2. The film was then developed with 1.0 mass % aqueous sodium carbonate solution for 60 seconds. The exposure quantity giving an image at a residual sensitivity of step 7, as determined with Kodak step tablet No. 2 (step 21) was considered to be the optimal irradiation intensity.

<Absorbance>

The absorbance was determined by using an ultraviolet-visible spectrophotometer (Ubest V-570DS manufactured by JASCO Corp.) and an integrating-sphere photometer (ISN-470 manufactured by JASCO Corp.). Each of the alkali development-type solder resists obtained in the Examples and the Comparative Examples above was applied on a glass plate with an applicator and dried in a hot air-circulating drying oven at 80° C. for 30 minutes, to give a dry film of the alkali development-type solder resist on the glass plate. The absorbance base line was drawn in a wavelength range of 500 to 300 nm by using the same glass plate as that used for application of the alkali development-type solder resist, by using the ultraviolet-visible spectrophotometer and the integrating-sphere photometer. The absorbance of each glass plate carrying a dry film was determined; and the absorbance of the dry film was calculated from the base line, to give the absorbance of the desirable light (at a wavelength of 355 nm for the films obtained with the resists shown in Table 1-1 and at a wavelength of 405 nm for those in Table 1-2). For prevention of deviation in absorbance due to the difference in film thickness, the operation was repeated four times while the coating thickness with applicator was changed in four orders; a graph showing the relationship between the coating thickness and the absorbance at 355 or 405 nm was obtained; and the absorbance of a dry film at a film thickness of 25 μm was calculated, based on the approximate expression thus obtained.

The evaluation results are summarized in Tables 2-1 and 2-2.

<In-Depth Hardenability>

Each of the alkali development-type solder resists obtained in the Examples and Comparative Examples was applied by screen printing on a substrate carrying a circuit pattern having a line/space ratio of 300/300 and having a dry thickness of 35 μm, which was previously polished with buff rolls, washed with water, and dried, and the film was dried in a hot air-circulating drying oven at 80° C. for 30 minutes. After drying, the films of those obtained in the Examples and the Comparative Examples shown in Table 1-1 were exposed to light in a direct imaging apparatus emitting a semiconductor laser at a maximum wavelength of 350 to 375 nm, while the films of those in Table 1-2 were exposed to light, in a direct imaging apparatus emitting a semiconductor laser at a maximum wavelength of 400 to 410 nm. The exposure pattern used was a pattern having lines of 20, 30, 40, 50, 60, 70, 80, 90 and 100 μm in width in the space area. The irradiation intensity used was the irradiation intensity obtained by evaluation of the optimal irradiation intensity above. After photoirradiation, a pattern is formed by development with a 1 mass % aqueous sodium carbonate solution at 30° C. and hardened at 150° C. for 60 minutes, to give a hardened film.

The number of the minimum residual lines on the hardened film of the alkali development-type solder resist obtained was counted under an optical microscope at a 200-times magnification. In addition, the line was cut at the center; and the section was mirror-surface finished and observed under an optical microscope adjusted to a 1000-times magnification, to give the top and bottom diameters of the minimum residual line in the hardened film and the film thickness. In evaluation, smaller minimum residual line and a bottom diameter closer to the designed value are considered to be favorable in in-depth hardenability. The evaluation results are summarized in Tables 2-1 and 2-2.

<Film Color>

Each of the alkali development-type solder resists obtained in the Examples and the Comparative Examples above was hardened under a condition similar to that for the surface hardenability test described above, and the color of the cured product was evaluated by visual observation.

<Electroless Gold Plating Resistance>

Each of the alkali development-type solder resists obtained in the Examples and the Comparative Examples above was painted on the entire surface of a FR-4 substrate carrying a circuit formed by screen printing. The substrate was then dried in a hot air-circulating drier at 80° C. for 30 minutes; a negative pattern was placed thereon; the substrate shown in Table 1-1 was exposed to light in a direct imaging apparatus emitting a semiconductor laser at a maximum wavelength of 350 to 375 nm at the optimal exposure quantity, while the substrate shown in Table 1-2 were exposed to light in a direct imaging apparatus emitting a semiconductor laser at a maximum wavelength of 400 to 410 nm at the optimal exposure quantity. Then, the substrate was developed with 1.0 mass % aqueous sodium carbonate solution for 60 seconds.

The test substrate thus obtained was plated with nickel to a thickness of 3 μm and with gold to a thickness of 0.03 μm in a commercially available electroless nickel plating bath and an electroless gold plating bath, and the surface state of the hardened film was observed. The evaluation criteria are as follows:

⊚: No change at all
◯: Almost no change
Δ: Some film separation or clouding
x: Distinctive film separation or clouding The evaluation results are summarized in Tables 2-1 and 2-2.

<Boiling Test>

Each of the alkali development-type solder resists obtained in the Examples and the Comparative Examples above was painted on the entire surface of a FR-4 substrate carrying a circuit formed by screen printing. The substrate was then dried in a hot air-circulating drier at 80° C. for 30 minutes; a negative pattern was placed thereon; the substrate shown in Table 1-1 was exposed to light in a direct imaging apparatus emitting a semiconductor laser light at a maximum wavelength of 350 to 375 nm at the optimal exposure quantity, while the substrate shown in Table 1-2, in a direct imaging apparatus emitting a semiconductor laser at a maximum wavelength of 400 to 410 nm at the optimal exposure quantity. The film was then developed with 1.0 mass % aqueous sodium carbonate solution for 60 seconds.

The test substrate thus obtained was immersed in a solder tank at 260° C. containing a water-soluble flux W121 manufactured by Mec Co., Ltd., and boiled in boiling water for 2 hours, and the color change of the cured product was evaluated by visual observation. The evaluation criteria were as follow:

◯: No change at all
Δ: Slight discoloration observable
x: Whitening on entire film.

The evaluation results are summarized in Tables 2-1 and 2-2.

<Water Absorption Percentage>

Each of the alkali development-type solder resists obtained in the Examples and the Comparative Examples above was coated by screen printing on a glass plate with a predetermined weight and dried in a hot air-circulating drying oven at 80° C. for 30 minute. After drying, the entire surface of the substrate shown in Table 1-1 was exposed to light in a direct imaging apparatus emitting a semiconductor laser light at a maximum wavelength of 350 to 375 nm at the optimal exposure quantity, while the entire surface of that shown in Table 1-2 were exposed to light, in a direct imaging apparatus emitting a semiconductor laser at a maximum wavelength of 400 to 410 mm at the optimal exposure quantity. After exposure, the substrate was developed with 1 mass % sodium carbonate aqueous solution at 30° C., and hardened under heat at 150° C. for 60 minutes, to give an evaluation sample. It was cooled to room temperature, and the weight of the evaluation sample was determined.

The evaluation sample was then immersed in ion-exchange water at 23° C.±2° C. for 24 hours, and the weight change was determined.

Water absorption=$(W2-W1)/(W1-Wg)$

In the formula, W1 represents the mass of the evaluation sample; W2 represents the mass of the evaluation sample after immersion in ion-exchange water for 24 hours; and Wg represents the mass of the glass plate.

The evaluation results are summarized in Tables 2-1 and 2-2.

TABLE 2-1

|  | Exam. | | | | | | | Comp. | | | |
| --- | --- | --- | --- | --- | --- | --- | --- | --- | --- | --- | --- |
|  | 1 | 2 | 3 | 4 | 5 | 6 | 7 | 1 | 2 | 3 | 4 |
| Surface hardenability | ◯ | ◯ | ◯ | ◯ | ◯ | ◯ | ◯ | ◯ | Δ | X | Δ |
| Cross sectional shape | A | A | A | A | A | C | A | E | B | B | A |
| Optimal irradiation intensity (mJ/cm$^2$) | 40 | 30 | 30 | 30 | 30 | 20 | 30 | 20 | 50 | 200 | 80 |
| 355 nm absorbance (per 25 μm of film thickness) | 0.60 | 0.47 | 0.64 | 0.80 | 0.59 | 1.00 | 0.58 | 1.66 | 0.23 | 0.74 | 0.59 |

TABLE 2-1-continued

|  | Exam. | | | | | | | Comp. | | | |
| --- | --- | --- | --- | --- | --- | --- | --- | --- | --- | --- | --- |
|  | 1 | 2 | 3 | 4 | 5 | 6 | 7 | 1 | 2 | 3 | 4 |
| Minimum residual line width (μm) | 50 | 30 | 40 | 50 | 40 | 60 | 40 | 130 | 30 | 90 | 60 |
| Color of coated film | Green | Yellow | Green | Green | Green | Green | Green | Green | Yellow | Green | Green |
| Electroless gold plating resistance | ◎ | ◎ | ◎ | ◎ | ◎ | ◎ | ◎ | Δ | ○ | Δ | Δ |
| Boiling test (Discoloration) | ○ | ○ | ○ | ○ | ○ | ○ | ○ | ○ | Δ | X | X |
| Water absorption (%) | 1.2 | 1.0 | 1.0 | 1.0 | 1.0 | 1.0 | 0.9 | 1.2 | 1.4 | 1.6 | 1.6 |

TABLE 2-2

|  | Exam. | | | Comp. | | | |
| --- | --- | --- | --- | --- | --- | --- | --- |
|  | 8 | 9 | 10 | 5 | 6 | 7 | 8 |
| Surface hardenability | ○ | ○ | ○ | ○ | Δ | Δ | Δ |
| Cross sectional shape | A | A | A | E | B | A | A |
| Optimal irradiation intensity (mJ/cm$^2$) | 30 | 30 | 50 | 20 | 80 | 250 | 60 |
| 405 nm absorbance (per 25 μm of film thickness) | 0.40 | 0.46 | 0.87 | 1.39 | 0.06 | 0.39 | 0.87 |
| Minimum residual line width (μm) | 20 | 20 | 30 | 130 | 30 | 100 | 80 |
| Color of coated film | Achroma | Blue | Green | Green | Achroma | Blue | Green |
| Electroless gold plating resistance | ◎ | ◎ | ◎ | Δ | ○ | Δ | Δ |
| Boiling test (Discoloration) | ○ | ○ | ○ | ○ | Δ | X | X |
| Water absorption (%) | 1.0 | 1.0 | 1.0 | 1.2 | 1.4 | 1.6 | 1.6 |

A similar evaluation of properties was performed, but the exposure machine was changed from the direct imaging apparatus emitting a semiconductor laser at a maximum wavelength of 350 to 375 nm or a semiconductor laser at a maximum wavelength of 400 to 410 nm to a contact-exposure machine equipped with a metal halide lamp (GW20 manufactured by ORC).

The results are summarized in Tables 3-1 and 3-2.

TABLE 3-1

|  | Exam. | | | | | | | Comp. | | | |
| --- | --- | --- | --- | --- | --- | --- | --- | --- | --- | --- | --- |
|  | 1 | 2 | 3 | 4 | 5 | 6 | 7 | 1 | 2 | 3 | 4 |
| Surface hardenability | ○ | ○ | ○ | ○ | ○ | ○ | ○ | ○ | ○ | Δ | ○ |
| Cross sectional shape | E | E | E | E | E | E | E | E | B | A | E |
| Optimal irradiation intensity (mJ/cm$^2$) | 30 | 20 | 20 | 30 | 20 | 20 | 30 | 20 | 40 | 150 | 60 |
| 355 nm absorbance (per 25 μm of film thickness) | 0.60 | 0.47 | 0.64 | 0.80 | 0.59 | 1.00 | 0.58 | 1.66 | 0.23 | 0.74 | 0.59 |
| Minimum residual line width (μm) | 50 | 30 | 30 | 40 | 30 | 40 | 40 | 100 | 30 | 80 | 50 |
| Color of coated film | Green | Yellow | Green | Green | Green | Green | Green | Green | Yellow | Green | Green |
| Electroless gold plating resistance | ◎ | ◎ | ◎ | ◎ | ◎ | ◎ | ◎ | Δ | ○ | Δ | Δ |
| Boiling test (Discoloration) | ○ | ○ | ○ | ○ | ○ | ○ | ○ | ○ | Δ | Δ | Δ |
| Water absorption (%) | 1.2 | 1.0 | 1.0 | 1.0 | 1.0 | 1.0 | 0.9 | 1.2 | 1.4 | 1.6 | 1.6 |

TABLE 3-2

|  | Exam. | | | Comp. | | | |
| --- | --- | --- | --- | --- | --- | --- | --- |
|  | 8 | 9 | 10 | 5 | 6 | 7 | 8 |
| Surface hardenability | ○ | ○ | ○ | ○ | ○ | ○ | ○ |
| Cross sectional shape | E | E | E | E | A | A | E |
| Optimal irradiation intensity (mJ/cm$^2$) | 10 | 10 | 30 | 10 | 20 | 200 | 50 |
| 405 nm absorbance (per 25 μm of film thickness) | 0.40 | 0.46 | 0.87 | 1.39 | 0.06 | 0.39 | 0.87 |
| Minimum residual line width (μm) | 30 | 30 | 40 | 100 | 30 | 60 | 60 |

TABLE 3-2-continued

|  | Exam. | | | Comp. | | | |
| --- | --- | --- | --- | --- | --- | --- | --- |
|  | 8 | 9 | 10 | 5 | 6 | 7 | 8 |
| Color of coated film | Achroma | Blue | Green | Green | Achroma | Blue | Green |
| Electroless gold plating resistance | ◎ | ◎ | ◎ | Δ | ○ | ○ | Δ |
| Boiling test (Discoloration) | ○ | ○ | ○ | ○ | Δ | Δ | Δ |
| Water absorption (%) | 1.0 | 1.0 | 1.0 | 1.2 | 1.4 | 1.6 | 1.6 |

As is obvious from the results shown in Table 2-1, the alkali development-type solder resist according to the present invention in the first embodiment has high photopolymerization potential and sufficient in-depth hardenability to a laser beam at a wavelength of 350 to 375 nm and is superior in electroless gold plating resistance, boiling resistance and water absorption. On the other hand, the substrates obtained in Comparative Examples 1 and 3 where no oxime-based photopolymerization initiator was used, were unfavorable in cross-sectional shape and minimum residual line width. The substrate obtained in Comparative Example 2, wherein all of the constituent components according to the present invention are contained but the absorbance is outside the range of the present invention, was also inferior in surface hardenability and cross-sectional shape. Further, the substrate obtained in Comparative Example 4, wherein a commonly carboxyl group-containing photosensitive resin was used, was inferior in surface hardenability, water absorption, etc.

Comparison of the results in Table 2-1 with those in Table 3-1 reveals that the replacement of the exposure machine from a direct imaging apparatus emitting a semiconductor laser at a maximum wavelength of 350 to 375 nm to a contact exposure machine equipped with a metal halide lamp results in deterioration in cross-sectional shape, indicating that the alkali development-type solder resist according to the present invention is suitable for a direct imaging apparatus emitting a semiconductor laser light at a maximum wavelength of 350 to 375 nm.

In addition, as is obvious from the results shown in Table 2-2, the alkali development-type solder resist in the second embodiment of the present invention has a high photopolymerization potential to a laser beam at a wavelength of 400 to 410 nm and sufficient in-depth hardenability and is superior in electroless gold plating resistance, boiling resistance, and water absorption. On the other hand, the substrates obtained in Comparative Examples 1 and 3, wherein no sensitizer (E) or oxime-based photopolymerization initiator (B) according to the present invention was used, were unfavorable in cross-sectional shape and minimum residual line width. The substrate obtained in Comparative Example 2, wherein all of the constituent components according to the present invention are contained but the absorbance is outside the range of the present invention, was inferior in surface hardenability and cross-sectional shape. Further, the substrate obtained in Comparative Example 4, wherein a commonly carboxyl group-containing photosensitive resin was used, was inferior in surface hardenability, water absorption, etc.

Comparison of the results in Table 2-2 with those in Table 3-2 reveals that the replacement of the exposure machine from a direct imaging apparatus emitting a semiconductor laser at a maximum wavelength of 400 to 410 nm to a contact exposure machine equipped with a metal halide lamp results in deterioration in cross-sectional shape, indicating that the alkali development-type solder resist according to the present invention is suitable for a direct imaging apparatus emitting a semiconductor laser light at a maximum wavelength of 400 to 410 nm.

What is claimed is:

1. A solder resist developable with a dilute aqueous alkali solution comprising:
   (A) a carboxyl group-containing photosensitive resin obtained by reacting (a) a compound having two or more cyclic ether groups or cyclic thioether groups in the molecule with (b) an unsaturated monocarboxylic acid; reacting the product with (c) a polybasic acid anhydride; reacting the resulting resin with (d) a compound having a cyclic ether group and an ethylenic unsaturated group in the molecule; and reacting the product additionally with (c) the polybasic acid anhydride;
   (B) an oxime ester photopolymerization initiator comprising an oxime ester group represented by the following General Formula (I):

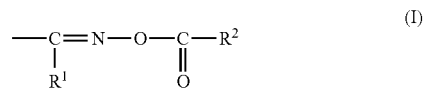

(wherein R1 represents a hydrogen atom, an alkyl group having 1 to 7 carbon atoms, or a phenyl group; and R2 represents an alkyl group having 1 to 7 carbon atoms or a phenyl group);
   (C) a compound having two or more ethylenic unsaturated groups in the molecule; and
   (D) a thermosetting component,
   wherein the dry film obtained by applying the composition has an absorbance of 0.3 to 1.2 per 25 μm of the film thickness at a wavelength of 350 to 375 nm,
   the unsaturated monocarboxylic acid (b) comprises (b-1) an acrylic or methacrylic acid and (b-2) a compound represented by the following General Formula (II):

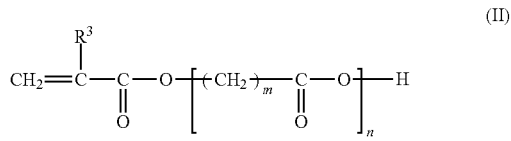

where R3 represents a hydrogen atom or a methyl group, m is an integer of 3 to 7, and an average value of n is an integer of 1 to 4.

2. The solder resist according to claim 1, further comprising (F) an aminoacetophenone photopolymerization initiator having the structure represented by the following General Formula (III) and/or (G) an acylphosphine oxide photopolymerization initiator represented by the following General Formula (IV):

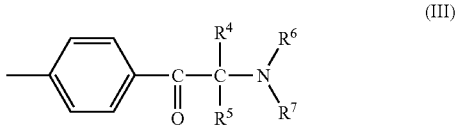
(III)

wherein, R4 and R5 each represent an alkyl or aryl alkyl group having 1 to 12 carbon atoms; and R6 and R7 each represent a hydrogen atom, an alkyl group having 1 to 6 carbon atoms or jointly represent a cyclic alkyl group,

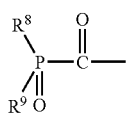
(IV)

wherein, R8 and R9 each represent a straight-chain or branched alkyl group having 1 to 6 carbon atoms, a cyclohexyl group, a cyclopentyl group, an aryl group, or an aryl group substituted with a halogen atom, an alkyl group or an alkoxy group, or one of them represents a carbonyl group having 1 to 20 carbon atoms.

3. The solder resist according to claim 1, wherein the oxime ester photopolymerization initiator (B) comprises at least one compound selected from the group consisting of compounds represented by the following Formulae (V), (VI) and (VII):

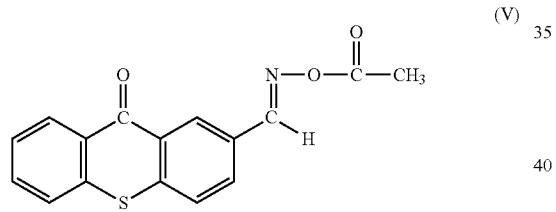
(V)

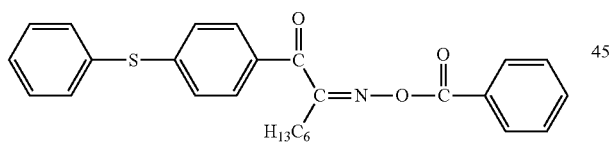
(VI)

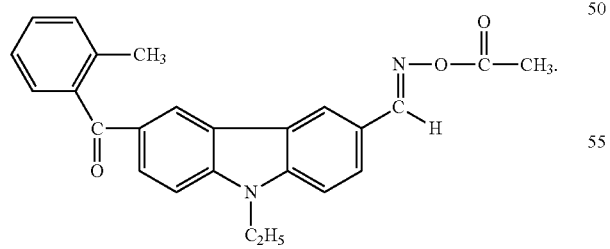
(VII)

4. The solder resist according to claim 1, further comprising (H) a filler.

5. The solder resist according to claim 1, wherein the thermosetting component (D) is a thermosetting component having two or more cyclic ether groups and/or cyclic thioether groups in the molecule.

6. A dry film of solder resist, obtained by applying and drying the solder resist according to claim 1 on a carrier film.

7. A cured product, obtained by photocuring the dry film according to claim 6.

8. A cured product, obtained by photocuring the dry film according to claim 6 by using a laser-emitting light source.

9. A printed wiring board, including an insulation layer obtained by photocuring the dry film according to claim 6 by using a laser beam at a maximum wavelength of 350 to 375 mm and then heat-hardening the resulting film.

10. A printed wiring board comprising:
a copper circuit; and
a layer of a cured product of the solder resist according to claim 1 on the copper circuit.

11. A cured product, obtained by photocuring the solder resist according to claim 1 by using a laser-emitting light source.

12. A printed wiring board, including an insulation layer obtained by photocuring a film formed with the solder resist according to claim 1, with a laser beam at a maximum wavelength of 350 to 375 nm and then heat-hardening the resulting film.

13. A solder resist developable with a dilute aqueous alkali solution comprising:
(A) a carboxyl group-containing photosensitive resin obtained by reacting (a) a compound having two or more cyclic ether groups or cyclic thioether groups in the molecule with (b) an unsaturated monocarboxylic acid; reacting the product with (c) a polybasic acid anhydride; reacting the resulting resin with (d) a compound having a cyclic ether group and an ethylenic unsaturated group in the molecule; and reacting the product additionally with (c) the polybasic acid anhydride;
(B) an oxime ester photopolymerization initiator comprising an oxime ester group represented by the following General Formula (I):

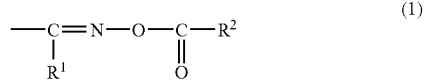
(I)

(wherein R1 represents a hydrogen atom, an alkyl group having 1 to 7 carbon atoms, or a phenyl group; and R2 represents an alkyl group having 1 to 7 carbon atoms or a phenyl group);
(C) a compound having two or more ethylenic unsaturated groups in the molecule;
(D) a thermosetting component; and
(E) at least one sensitizer selected from the group consisting of thioxanthone sensitizer, coumarin sensitizer and alkylaminobenzophenone sensitizer,
wherein the dry film obtained by applying the composition has an absorbance of 0.3 to 1.2 per 25 μm of the film thickness at a wavelength of 400 to 410 nm, and
the unsaturated monocarboxylic acid (b) comprises (b-1) an acrylic or methacrylic acid and (b-2) a compound represented by the following General Foimula (II):

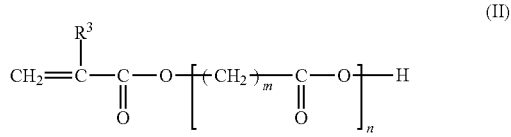
(II)

where R3 represents a hydrogen atom or a methyl group, m is an integer of 3 to 7, and an average value of n is an integer of 1 to 4.

14. The solder resist according to claim 13, further comprising (F) an aminoacetophenone photopolymerization initiator having the structure represented by the following General Formula (III) and/or (G) an acylphosphine oxide photopolymerization initiator represented by the following General Formula (IV):

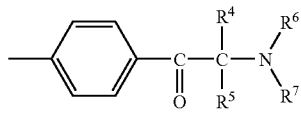
(III)

wherein, R4 and R5 each represent an alkyl or aryl alkyl group having 1 to 12 carbon atoms; and R6 and R7 each represent a hydrogen atom, an alkyl group having 1 to 6 carbon atoms or jointly represent a cyclic alkyl group,

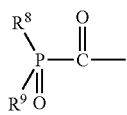
(IV)

wherein, R8 and R9 each represent a straight-chain or branched alkyl group having 1 to 6 carbon atoms, a cyclohexyl group, a cyclopentyl group, an aryl group, or an aryl group substituted with a halogen atom, an alkyl group or an alkoxy group, or one of them represents a carbonyl group having 1 to 20 carbon atoms.

15. The solder resist according to claim 13, wherein the oxime ester photopolymerization initiator (B) comprises at least one compound selected from the group consisting of compounds represented by the following Formulae (V), (VI) and (VII):

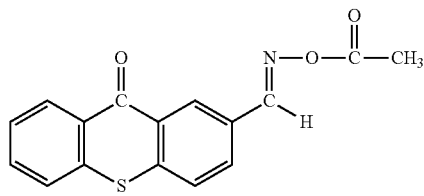
(V)

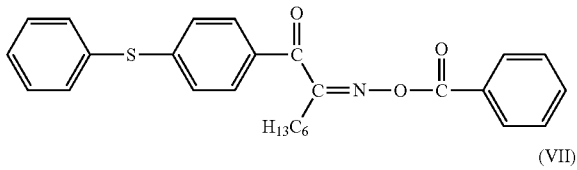
(VI)

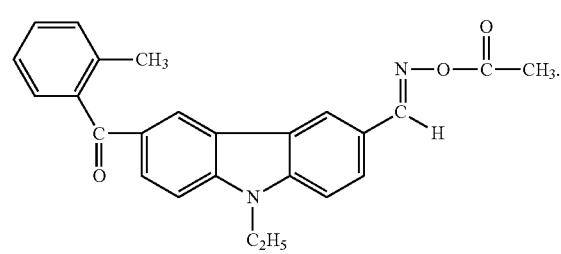
(VII)

16. The solder resist according to claim 13, further comprising (H) a filler.

17. The solder resist according to claim 13, wherein the thermosetting component (D) is a thermosetting component having two or more cyclic ether groups and/or cyclic thioether groups in the molecule.

18. A dry film of solder resist, obtained by applying and drying the solder resist according to claim 13 on a carrier film.

19. A cured product, obtained by photocuring the dry film according to claim 18.

20. A cured product, obtained by photocuring the dry film according to claim 18 by using a laser-emitting light source.

21. A printed wiring board, including an insulation layer obtained by photocuring the dry film according to claim 18 by using a laser beam at a maximum wavelength of 400 to 410 mm and then heat-hardening the resulting film.

22. A printed wiring board comprising:
a copper circuit; and
a layer of a cured product of the solder resist according to claim 13 on the copper circuit.

23. A cured product, obtained by photocuring the solder resist according to claim 13 by using a laser-emitting light source.

24. A printed wiring board, including an insulation layer obtained by photocuring a film formed with the solder resist according to claim 13 by using a laser beam at a maximum wavelength of 400 to 410 nm and then heat-hardening the resulting film.

* * * * *